(12) United States Patent
Lin et al.

(10) Patent No.: US 10,730,745 B2
(45) Date of Patent: Aug. 4, 2020

(54) SEMICONDUCTOR DEVICE AND METHOD OF FORMING MEMS PACKAGE

(71) Applicant: STATS ChipPAC Pte. Ltd., Singapore (SG)

(72) Inventors: Yaojian Lin, Jiangyin (CN); Il Kwon Shim, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/610,997

(22) Filed: Jun. 1, 2017

(65) Prior Publication Data

US 2017/0260043 A1 Sep. 14, 2017

Related U.S. Application Data

(63) Continuation of application No. 15/008,347, filed on Jan. 27, 2016, now Pat. No. 9,701,534.

(60) Provisional application No. 62/108,664, filed on Jan. 28, 2015.

(51) Int. Cl.
*H01L 23/48* (2006.01)
*B81B 7/00* (2006.01)

(52) U.S. Cl.
CPC ...... *B81B 7/007* (2013.01); *B81B 2201/0257* (2013.01); *B81B 2207/012* (2013.01); *B81B 2207/096* (2013.01); *H01L 2224/48091* (2013.01); *H01L 2924/15151* (2013.01)

(58) Field of Classification Search
CPC ... H01L 24/49; H01L 24/85; H01L 2924/142; H01L 2924/386; H01L 25/18; H01L 25/105; H01L 25/0657; H01L 23/49816; H01L 23/3128; H01L 23/49827; H01L 23/481; H01L 23/50; B81B 7/007; (Continued)

(56) References Cited

U.S. PATENT DOCUMENTS

| 8,115,283 B1 * | 2/2012 | Bologna | B81B 7/0064 |
| | | | 257/659 |
| 8,921,955 B1 * | 12/2014 | Lee | B81B 7/0061 |
| | | | 257/416 |
| 9,595,513 B2 * | 3/2017 | Fogal | H01L 25/18 |

(Continued)

*Primary Examiner* — Hoa B Trinh
(74) *Attorney, Agent, or Firm* — Brian M. Kaufman; Robert D. Atkins; Atkins and Associates, P.C.

(57) ABSTRACT

A microelectromechanical system (MEMS) semiconductor device has a first and second semiconductor die. A first semiconductor die is embedded within an encapsulant together with a modular interconnect unit. Alternatively, the first semiconductor die is embedded within a substrate. A second semiconductor die, such as a MEMS die, is disposed over the first semiconductor die and electrically connected to the first semiconductor die through an interconnect structure. In another embodiment, the first semiconductor die is flip chip mounted to the substrate, and the second semiconductor die is wire bonded to the substrate adjacent to the first semiconductor die. In another embodiment, first and second semiconductor die are embedded in an encapsulant and are electrically connected through a build-up interconnect structure. A lid is disposed over the semiconductor die. In a MEMS microphone embodiment, the lid, substrate, or interconnect structure includes an opening over a surface of the MEMS die.

25 Claims, 26 Drawing Sheets

(58) Field of Classification Search
CPC ...... B81B 2201/0257; B81B 2207/096; B81B 2207/012
See application file for complete search history.

(56) References Cited

U.S. PATENT DOCUMENTS

| | | | |
|---|---|---|---|
| 9,738,515 B2* | 8/2017 | Bologna | B81C 1/00333 |
| 2009/0140413 A1* | 6/2009 | Wang | B81C 1/00269 |
| | | | 257/698 |
| 2015/0076628 A1* | 3/2015 | Bologna | B81C 1/00309 |
| | | | 257/416 |
| 2015/0371951 A1 | 12/2015 | Yeh et al. | |
| 2017/0374442 A1* | 12/2017 | Pennock | H04R 1/04 |

* cited by examiner

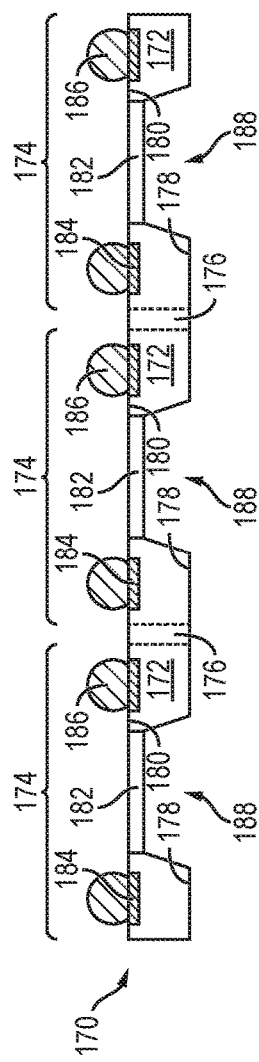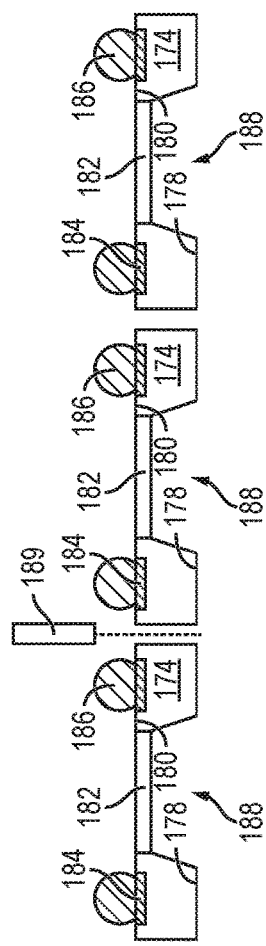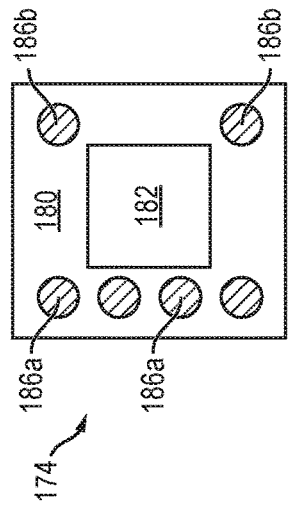

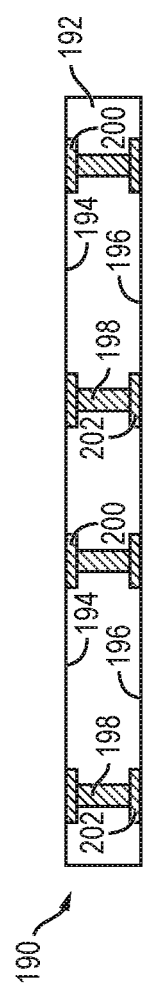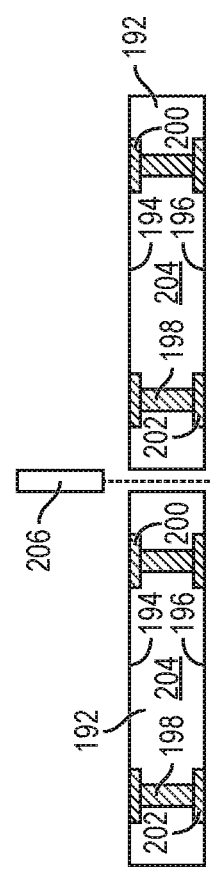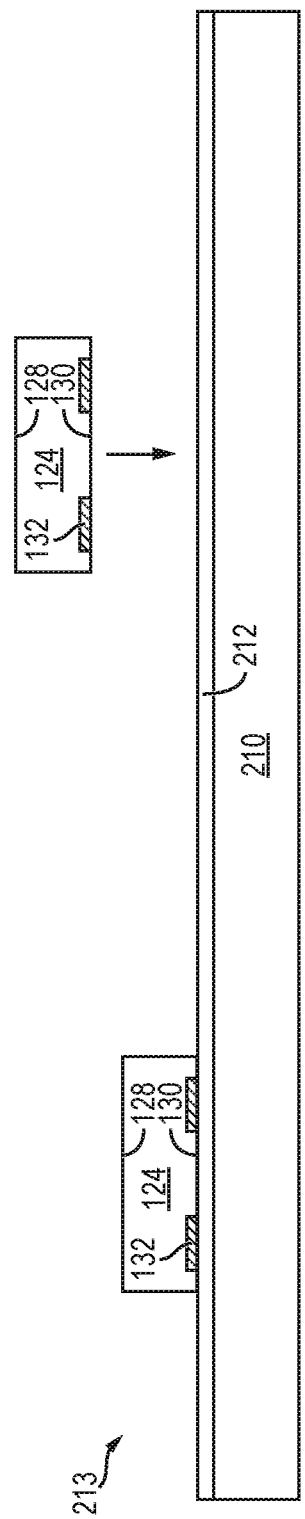

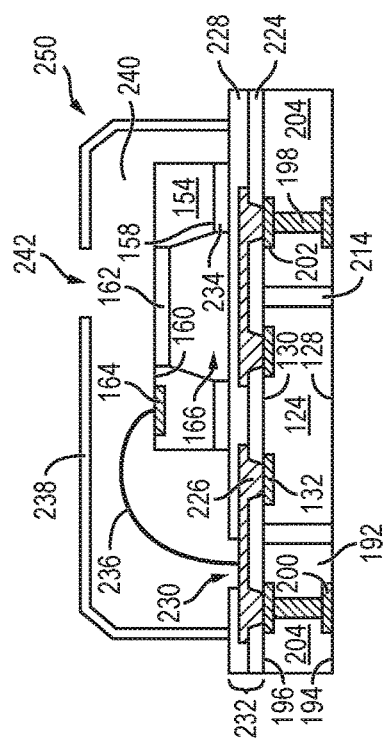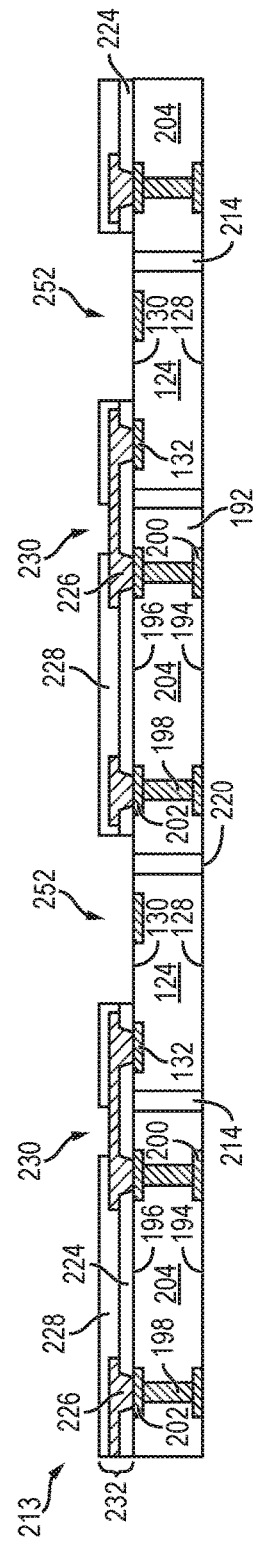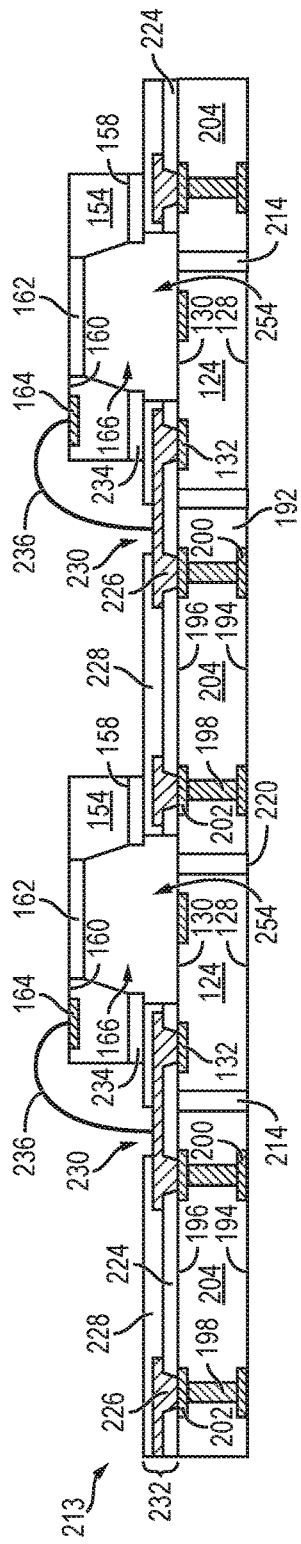

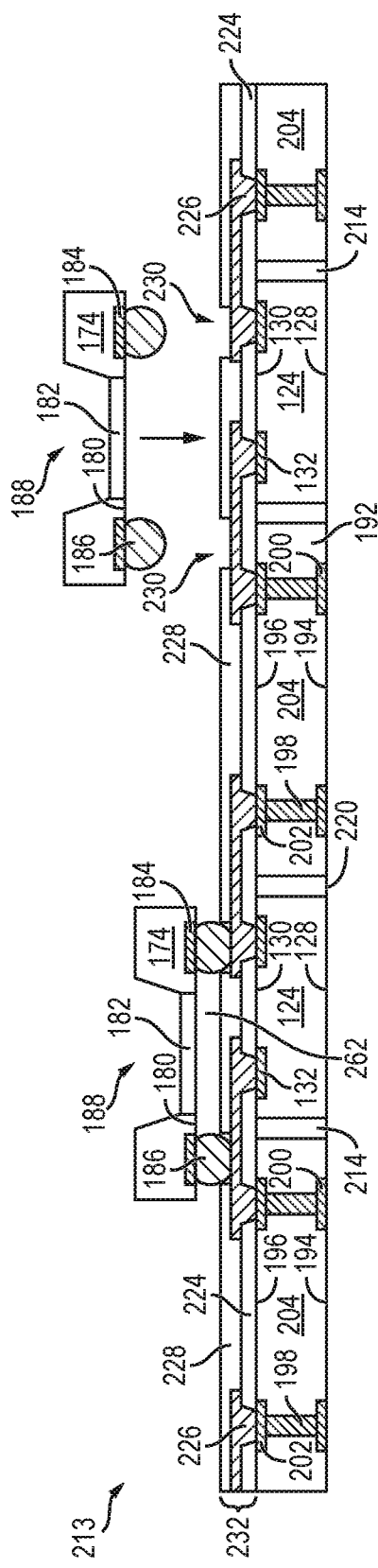
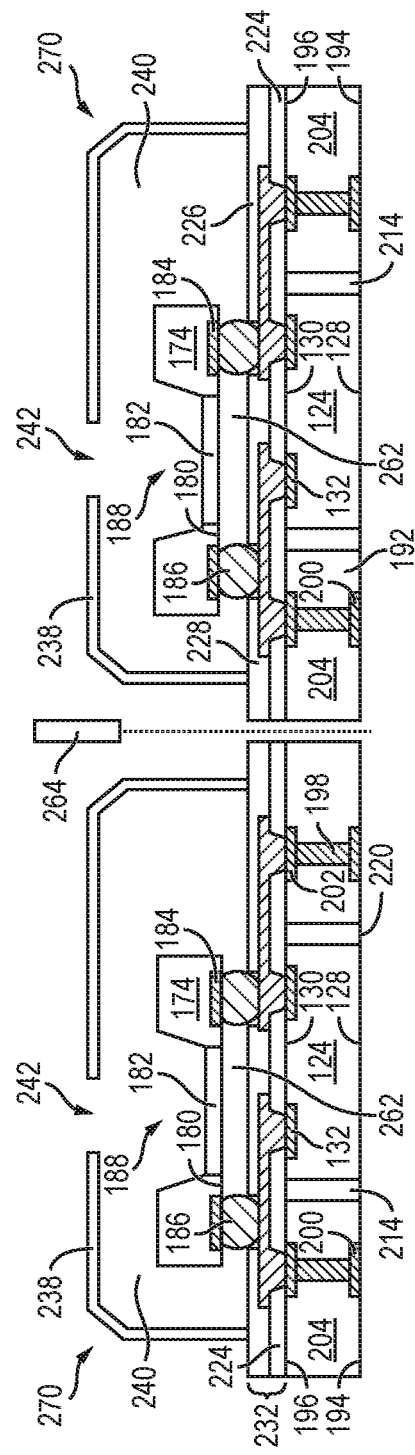
FIG. 9a
FIG. 9b

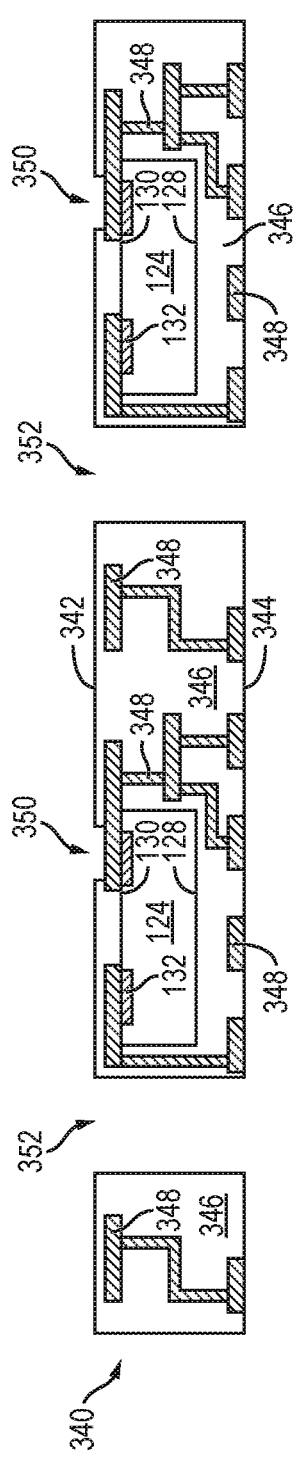
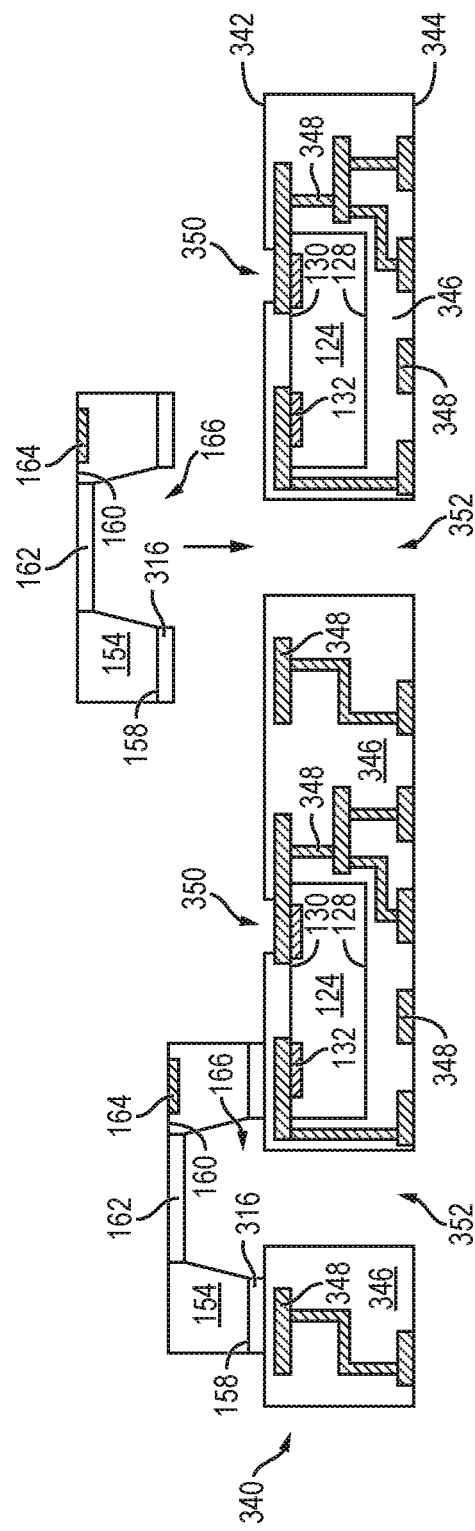

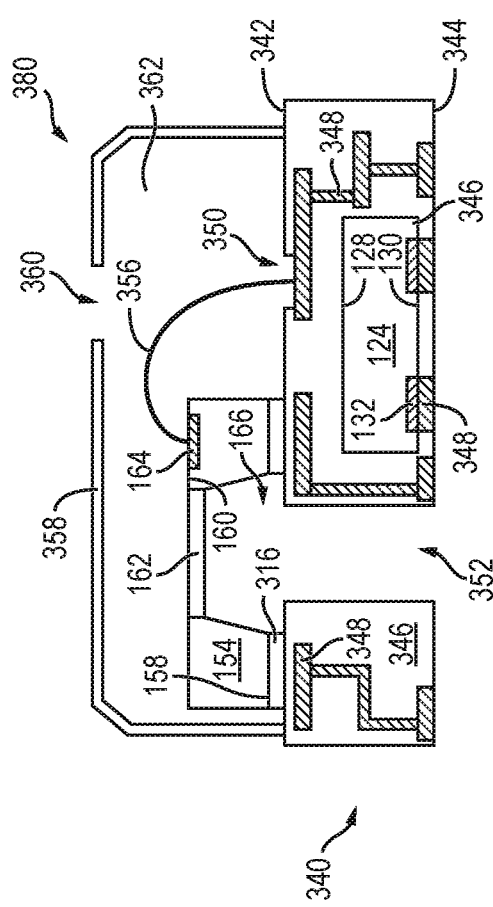

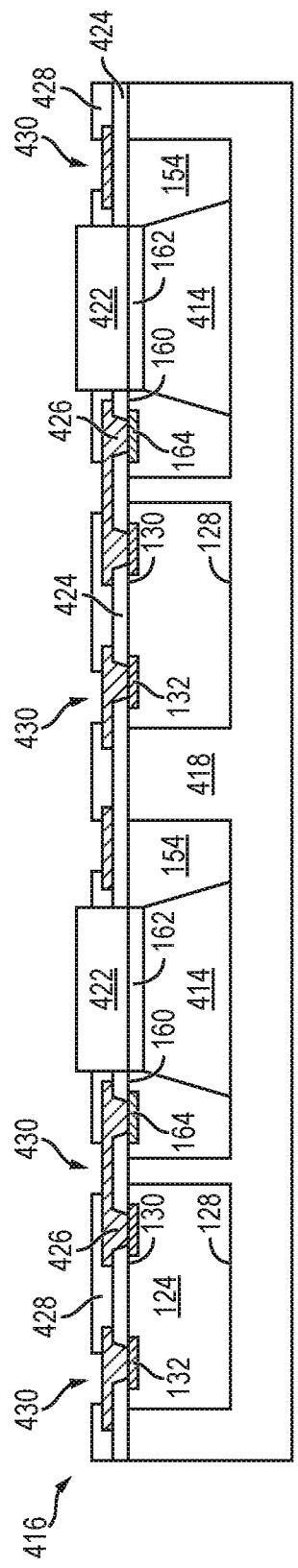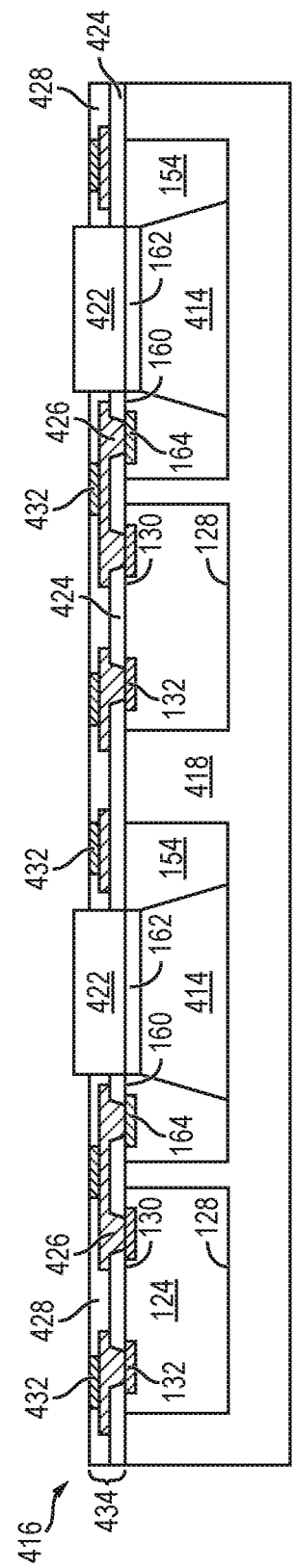

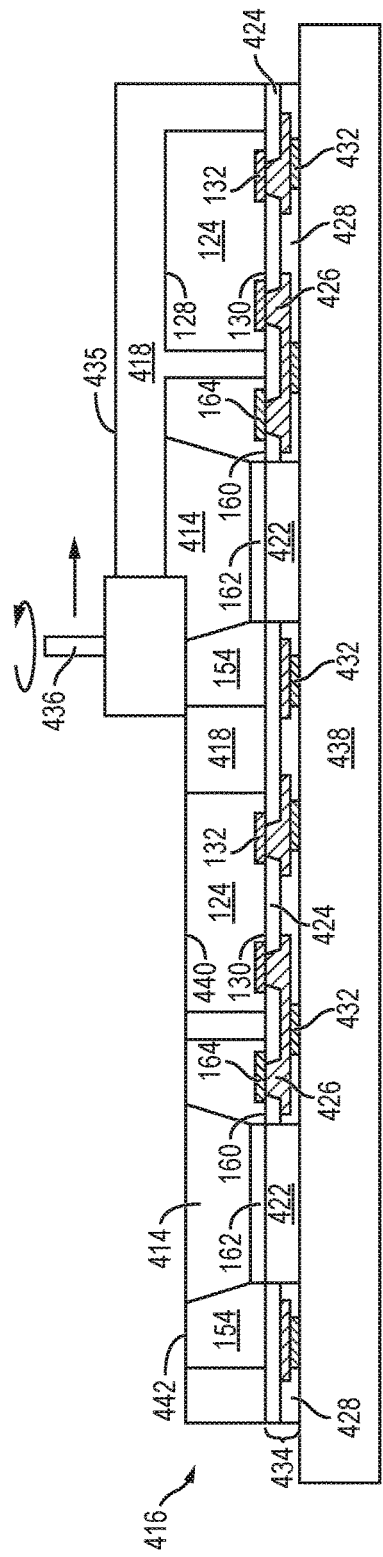
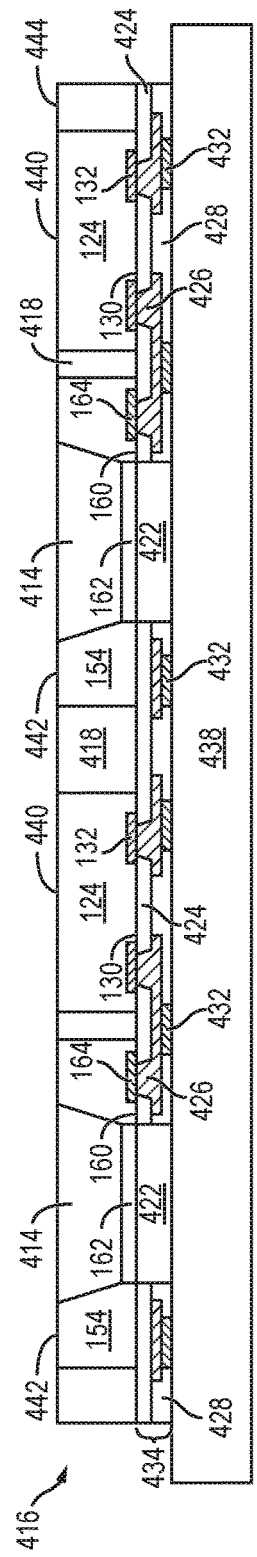
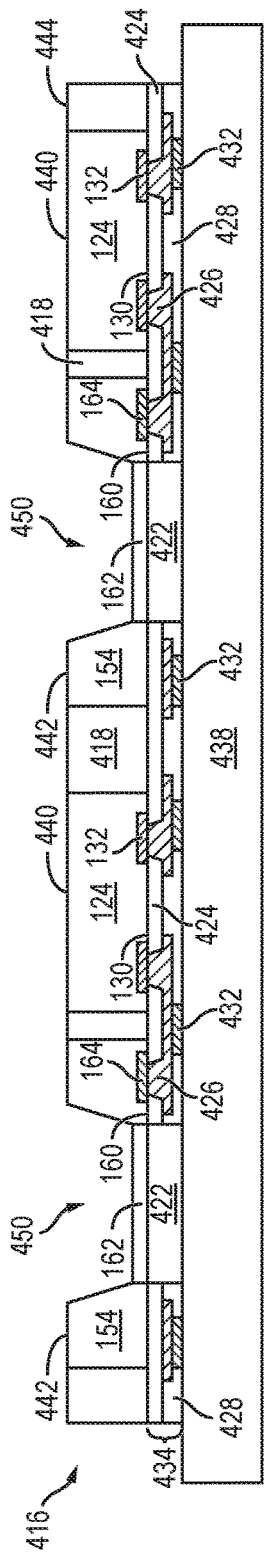
FIG. 20g
FIG. 20h
FIG. 20i

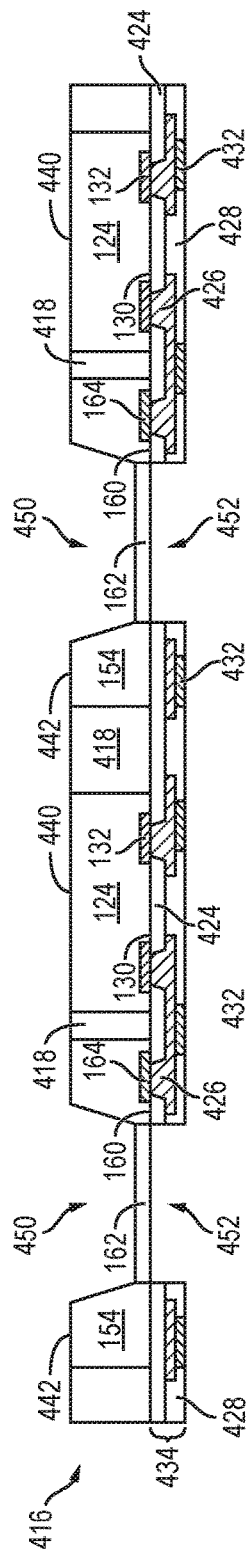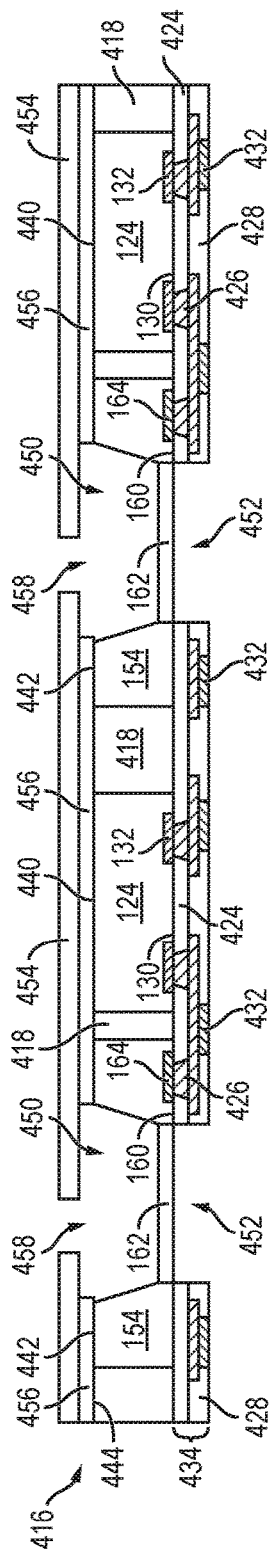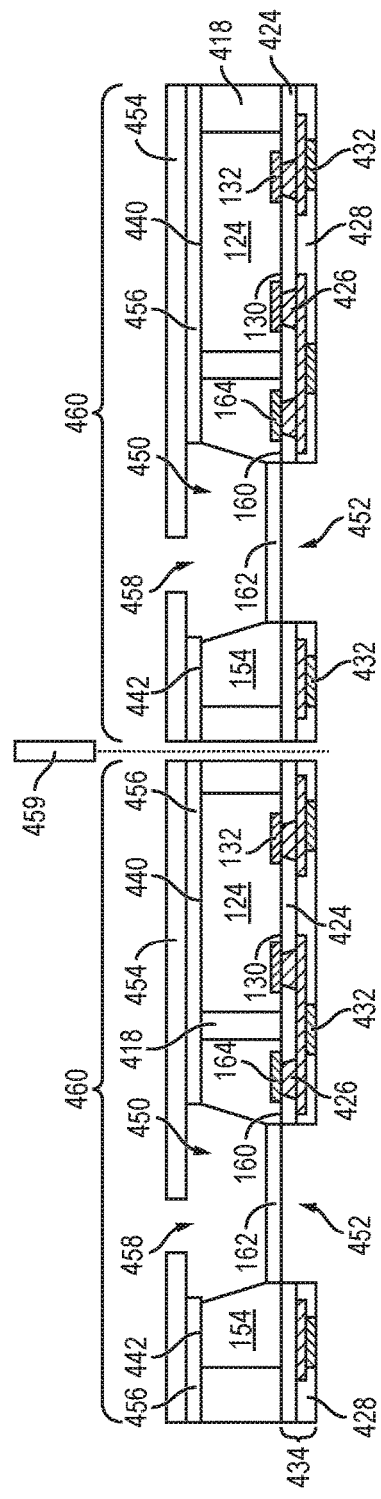

SEMICONDUCTOR DEVICE AND METHOD OF FORMING MEMS PACKAGE

CLAIM OF DOMESTIC PRIORITY

The present application is a continuation of U.S. patent application Ser. No. 15/008,347, now U.S. Pat. No. 9,701,534, filed Jan. 27, 2016, which claims the benefit of U.S. Provisional Application No. 62/108,664, filed Jan. 28, 2015, which applications are incorporated herein by reference.

FIELD OF THE INVENTION

The present invention relates in general to semiconductor devices and, more particularly, to a semiconductor device and method of forming a microelectromechanical system (MEMS) semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The manufacturing of smaller semiconductor devices relies on implementing improvements to horizontal and vertical electrical interconnection between multiple semiconductor devices on multiple levels, i.e., three dimensional (3D) device integration. A reduced package profile is of particular importance for packaging in the cellular or smart phone industry. Integration of multiple semiconductor die involves electrical interconnection between the multiple semiconductor die. Certain types of semiconductor die present unique packaging needs, such as semiconductor die having sensors responsive to external stimuli. Sensor-type semiconductor die impose additional space constraints for the interconnection to other semiconductor die within the package and to external devices. For example, a semiconductor die with a cavity may require an opening for sound or air access to the semiconductor die. One example of a cavity semiconductor die is the microelectromechanical system (MEMS) microphone, which is commonly found in cellular phones, smart phones, and similar applications. Other types of semiconductor die may have a similar cavity or sensor that functions by receiving and responding to external stimuli. It is difficult to achieve integration of such semiconductor die with space-efficient electrical interconnect while permitting external stimuli to reach the sensor area. Current interconnections and package configurations are limited in overall package size reduction that can be achieved in packages including sensors or MEMS semiconductor die, such as MEMS microphones.

BRIEF DESCRIPTION OF THE DRAWINGS

FIGS. 3a-3f illustrate alternative semiconductor wafers with a plurality of semiconductor die separated by a saw street;

FIGS. 4a-4b illustrate a method of forming modular interconnect units having vertical interconnect structures;

FIGS. 5a-5k illustrate a method of forming a MEMS package including a MEMS semiconductor die mounted over an embedded wafer level ball grid array (eWLB);

FIG. 6 illustrates a MEMS package including a MEMS semiconductor die mounted over an eWLB including a modular interconnect unit;

FIGS. 7a-7c illustrate a method of forming a MEMS package including a MEMS semiconductor die mounted over an eWLB with a chamber under the MEMS semiconductor die;

FIGS. 9a-9b illustrate a method of forming a MEMS package including a flipchip MEMS semiconductor die mounted over an eWLB;

FIGS. 15a-15d illustrate a method of forming a MEMS package including a MEMS semiconductor die mounted over a substrate with an embedded semiconductor die;

FIGS. 16-19 illustrate MEMS packages including a MEMS semiconductor die mounted over a substrate with an embedded semiconductor die;

FIGS. 20a-20l illustrate a method of forming a MEMS eWLB package including a MEMS semiconductor die disposed adjacent to a semiconductor die.

DETAILED DESCRIPTION OF THE DRAWINGS

Figure 1:
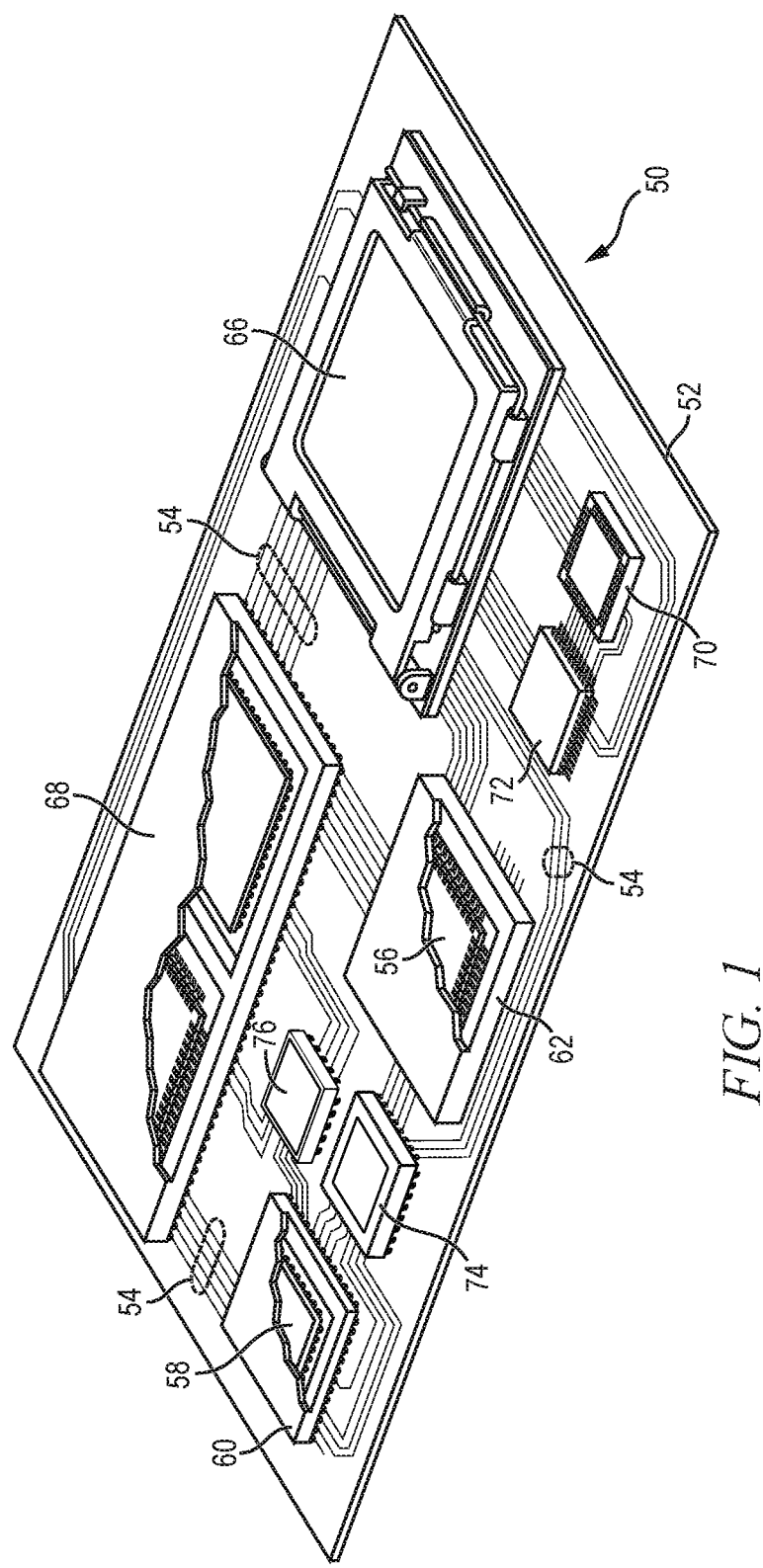
FIG. 1 illustrates a PCB with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
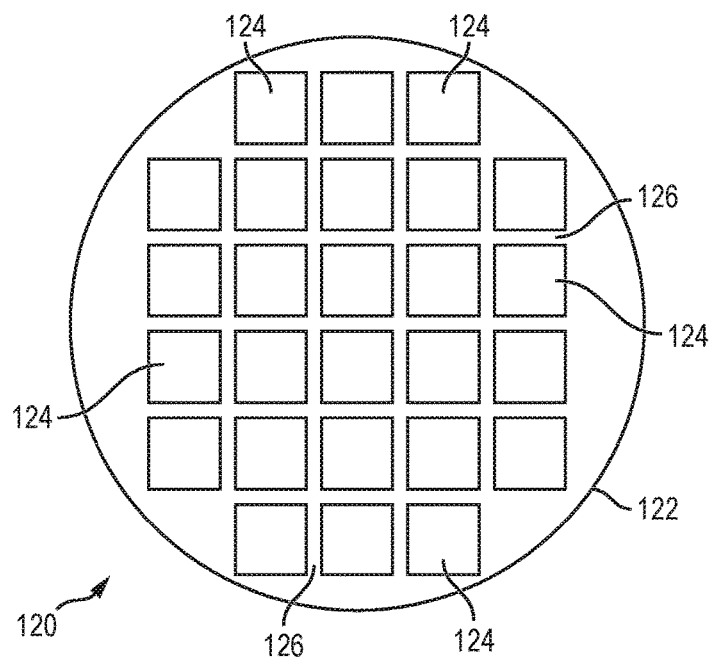
FIGS. 2a-2d illustrate a semiconductor wafer with a plurality of semiconductor die separated by a saw street.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
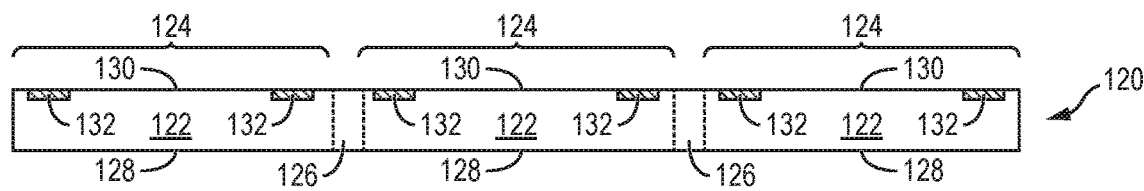

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. In one embodiment, semiconductor die 124 includes an ASIC. Semiconductor die 124 may also contain integrated passive devices (IPDs), such as inductors, capacitors, and resistors, for RF signal processing. Back surface 128 of semiconductor wafer 120 may undergo an optional backgrinding operation with a mechanical grinding or etching process to remove a portion of base material 122 and reduce the thickness of semiconductor wafer 120 and semiconductor die 124.

An electrically conductive layer 132 is formed over active surface 130 using PVD, CVD, electrolytic plating, electroless plating process, or other suitable metal deposition process. Conductive layers 132 includes one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
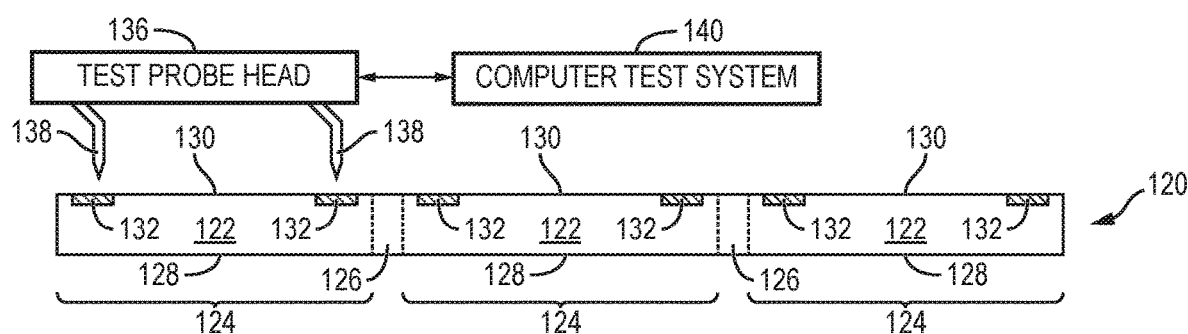

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 132 on each semiconductor die 124 and provide electrical stimuli to contact pads 132. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 2D:
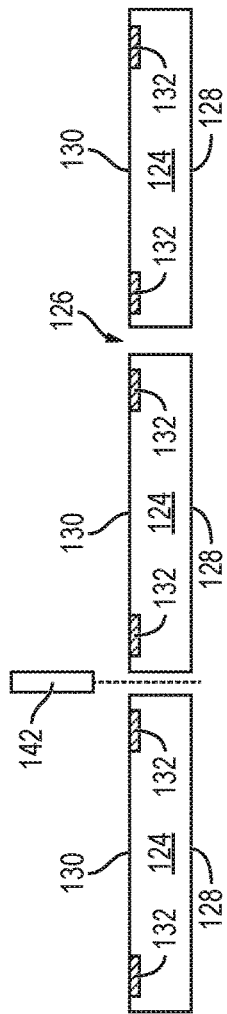

In FIG. 2d, semiconductor wafer 120 is singulated through saw street 126 using a saw blade or laser cutting tool 142 into individual semiconductor die 124. The individual semiconductor die 124 can be inspected and electrically tested for identification of KGD post singulation.

Figure 3A:
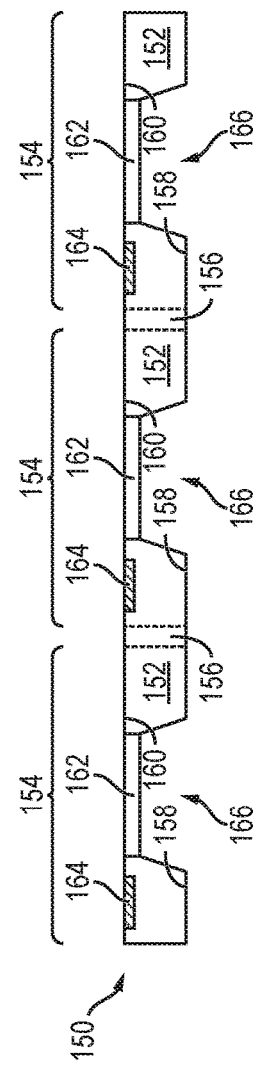

FIG. 3a shows a cross-sectional view of a portion of a semiconductor wafer 150, which may be similar to semiconductor wafer 120. Semiconductor wafer 150 has a base substrate material 152, such as silicon, germanium, aluminum phosphide, aluminum arsenide, gallium arsenide, gallium nitride, indium phosphide, silicon carbide, or other bulk semiconductor material for structural support. A plurality of semiconductor die or components 154 is formed on wafer 150 separated by a non-active, inter-die wafer area or saw street 156 as described above. Saw street 156 provides cutting areas to singulate semiconductor wafer 150 into individual semiconductor die 154. In one embodiment, semiconductor wafer 150 has a width or diameter of 100-450 mm.

Each semiconductor die 154 has a back or non-active surface 158 and an active surface 160 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 160 to implement analog circuits or digital circuits, such as DSP, ASIC, MEMS, memory, or other signal processing circuit. Semiconductor die 154 may also contain IPDs, such as inductors, capacitors, and resistors, for RF signal processing. Back surface 158 of semiconductor wafer 150 may undergo an optional backgrinding operation with a mechanical grinding or etching process to remove a portion of base material 152 and reduce the thickness of semiconductor wafer 150 and semiconductor die 154.

Semiconductor die 154 includes a sensor or active region 162. Active region 162 contains one or more active or passive sensors responsive to various external stimuli. An active sensor, such as a photodiode, a phototransistor, or a Hall effect device, generates or controls the flow of electrical current in response to an external stimulus. A passive sensor, such as a microphone, photoresistor, thermistor, capacitive accelerometer, or load cell, alters the relationship between voltage and current in response to the external stimulus. The external stimulus can be light, sound, pressure, acceleration, electromagnetic radiation, electrical or magnetic field, ionizing radiation, vibration, motion, rotation, orientation, temperature, or other stimulus. Active region 162 may include a piezoelectric and nanoelectronic device. Active region 162 is electrically connected to other analog and digital circuits on active surface 160 of semiconductor die 154 to perform functions in response to the external stimulus.

Figure 3C:
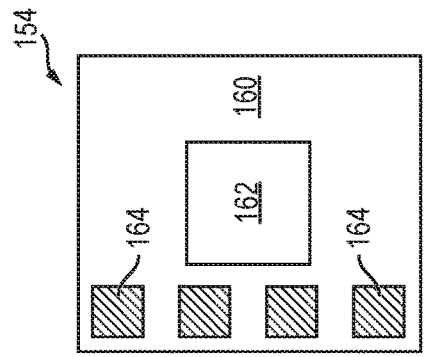

An electrically conductive layer 164 is formed over active surface 160 using PVD, CVD, electrolytic plating, electroless plating process, or other suitable metal deposition process. Conductive layer 164 includes one or more layers of Al, Cu, Sn, Ni, Au, Ag, or other suitable electrically conductive material. Conductive layer 164 operates as contact pads electrically connected to active region 162 and the circuits on active surface 160. Conductive layer 164 can be formed as contact pads disposed side-by-side a first distance from the edge of semiconductor die 154, as shown in FIG. 3c. Alternatively, conductive layer 164 can be formed as contact pads that are offset in multiple rows such that a first row of contact pads is disposed a first distance from the edge of the die, and a second row of contact pads alternating with the first row is disposed a second distance from the edge of the die.

In one embodiment, semiconductor die 154 includes a MEMS device, such as a MEMS microphone. Active region 162 may include a plurality of layers, such as one or more plates, membranes, or diaphragms formed over active surface 160 of semiconductor die 154. In a MEMS microphone, active region 162 may contain a fixed plate and a movable plate configured to respond to changes in air pressure caused by sound waves.

A cavity or chamber 166 is formed in semiconductor die 154. A portion of semiconductor die 154 is removed from back surface 158 by an etching process or other suitable process to form cavity 166 through semiconductor die 154. Cavity 166 may extend completely through semiconductor die 154 to active region 162. Cavity 166 operates to permit external stimuli, such as sound waves, to reach active region 162. For example, in a MEMS microphone, cavity 166 permits air flow to active region 162, and active region 162 responds to changes in air pressure caused by sound waves. Semiconductor die 154 includes an optional temporary protection or sacrificial layer, not shown, formed over one or more surfaces of semiconductor die 154. A sacrificial layer may include one or more layers of SiO2, Si3N4, SiON, Ta2O5, Al2O3, photoresist, liquid coating material, dry film, polymer film, polymer composite, or other material and is easily removed. A sacrificial layer may include polysilicon, silicon, or other bulk semiconductor material or suitable material. The sacrificial layer may be formed over semiconductor wafer 150 and may cover active surface 160 including active region 162, back surface 158, and may fill cavity 166 to make a planar back surface of semiconductor die 154. In another embodiment, an optional cover or cap, not shown, may be disposed over active surface 160 of semiconductor die 154 to protect active region 162.

Semiconductor wafer 150 undergoes electrical testing and inspection as part of a quality control process, similar to the testing described with respect to semiconductor wafer 120 in FIG. 2c. The active and passive components within semiconductor die 154 undergo testing at the wafer level for electrical performance and circuit function. Each semiconductor die 154 is tested for functionality and electrical parameters. The inspection and electrical testing of semiconductor wafer 150 enables semiconductor die 154 that pass to be designated as KGD for use in a semiconductor package.

Figure 3B:

In FIG. 3b, semiconductor wafer 150 is singulated through saw street 156 using a saw blade or laser cutting tool 168 into individual semiconductor die 154. The individual semiconductor die 154 can be inspected and electrically tested for identification of KGD post singulation.

FIG. 3c shows a plan view of active surface 160 of semiconductor die 154. Semiconductor die 154 includes various configurations of contact pads 164 according to the design and function of the die. Active surface 160 of semiconductor die 154 is electrically connected to contact pads 164 and active region 162. In one embodiment, contact pads 164 are formed along one or more edges of semiconductor die 154 while active region 162 remains devoid of contact pads 164. The configuration of contact pads 164 shown in FIG. 3c illustrates contact pads 164 disposed along a first edge of semiconductor die 154. In another embodiment, contact pads 164 are formed at one or more corners or edges of semiconductor die 154.

FIG. 3d shows a cross-sectional view of a portion of a semiconductor wafer 170, which may be similar to semiconductor wafer 120 or 150. Semiconductor wafer 170 has a base substrate material 172, such as silicon, germanium, aluminum phosphide, aluminum arsenide, gallium arsenide, gallium nitride, indium phosphide, silicon carbide, or other bulk semiconductor material for structural support. A plurality of semiconductor die or components 174 is formed on wafer 170 separated by a non-active, inter-die wafer area or saw street 176 as described above. Saw street 176 provides cutting areas to singulate semiconductor wafer 170 into individual semiconductor die 174. In one embodiment, semiconductor wafer 170 has a width or diameter of 100-450 mm.

Each semiconductor die 174 has a back or non-active surface 178 and an active surface 180 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 180 to implement analog circuits or digital circuits, such as DSP, ASIC, MEMS, memory, or other signal processing circuit. Semiconductor die 174 may also contain IPDs, such as inductors, capacitors, and resistors, for RF signal processing. Back surface 178 of semiconductor wafer 170 may undergo an optional backgrinding operation with a mechanical grinding or etching process to remove a portion of base material 172 and reduce the thickness of semiconductor wafer 170 and semiconductor die 174.

Semiconductor die 174 includes a sensor or active region 182. Active region 182 contains one or more active or passive sensors responsive to various external stimuli. An active sensor, such as a photodiode, a phototransistor, or a Hall effect device, generates or controls the flow of electrical current in response to an external stimulus. A passive sensor, such as a microphone, photoresistor, thermistor, capacitive accelerometer, or load cell, alters the relationship between voltage and current in response to the external stimulus. The external stimulus can be light, sound, pressure, acceleration, electromagnetic radiation, electrical or magnetic field, ionizing radiation, vibration, motion, rotation, orientation, temperature, or other stimulus. Active region 182 may include a piezoelectric and nanoelectronic device. Active region 182 is electrically connected to other analog and digital circuits on active surface 180 of semiconductor die 174 to perform functions in response to the external stimulus.

An electrically conductive layer 184 is formed over active surface 180 using PVD, CVD, electrolytic plating, electroless plating process, or other suitable metal deposition process. Conductive layers 184 includes one or more layers of Al, Cu, Sn, Ni, Au, Ag, or other suitable electrically conductive material. Conductive layer 184 operates as contact pads electrically connected to active region 182 and the circuits on active surface 180. Conductive layer 184 can be formed as contact pads disposed side-by-side a first distance from the edge of semiconductor die 174, as shown in FIG. 3c. Alternatively, conductive layer 184 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over conductive layer 184 using an evaporation, electrolytic plating, electroless plating, ball drop, or screen printing process. The bump material includes Al, Sn, Ni, Au, Ag, lead (Pb), bismuth (Bi), Cu, solder, or combinations thereof, with an optional flux solution. For example, the bump material can be eutectic Sn/Pb, high-lead solder, or lead-free solder. The bump material is bonded to conductive layer 184 using a suitable attachment or bonding process. In one embodiment, the bump material is reflowed by heating the material above the material's melting point to form spherical balls or bumps 186. In some applications, bumps 186 are reflowed a second time to improve electrical contact to conductive layer 184. The bumps can also be compression bonded to conductive layer 184. Bumps 186 represent one type of interconnect structure that is formed over conductive layer 184. The interconnect structure can also use bond wires, stud bump, Cu pillar, micro bump, or other electrical interconnect.

In one embodiment, semiconductor die 174 includes a MEMS device, such as a MEMS microphone. Active region 182 may include a plurality of layers, such as one or more plates, membranes, or diaphragms formed over active surface 180 of semiconductor die 174. In a MEMS microphone, active region 182 may contain a fixed plate and a movable plate configured to respond to changes in air pressure caused by sound waves.

A cavity or chamber 188 is formed in semiconductor die 174. A portion of semiconductor die 174 is removed from back surface 178 by an etching process or other suitable process to form cavity 188 through semiconductor die 174. Cavity 188 may extend completely through semiconductor die 174 to active region 182. Cavity 188 operates to permit external stimuli, such as sound waves, to reach active region 182. For example, in a MEMS microphone, cavity 188 permits air flow to active region 182, and active region 182 responds to changes in air pressure caused by sound waves. Cavity 188 may be formed after the formation of bumps 186. Semiconductor die 174 includes an optional temporary protection or sacrificial layer, not shown, formed over one or more surfaces of semiconductor die 174. A sacrificial layer may include one or more layers of $SiO_2$, $Si_3N_4$, SiON, $Ta_2O_5$, $Al_2O_3$, photoresist, liquid coating material, dry film, polymer film, polymer composite, or other material and is easily removed. A sacrificial layer may include polysilicon, silicon, or other bulk semiconductor material or suitable material. The sacrificial layer may be formed over semiconductor wafer 170 and may cover active surface 180 including active region 182, back surface 178, and may fill cavity 188 to make a planar back surface of semiconductor die 174. In another embodiment, an optional cover or cap, not shown, may be disposed over active surface 180 of semiconductor die 174 to protect active region 182.

Semiconductor wafer 170 undergoes electrical testing and inspection as part of a quality control process, similar to the testing described with respect to semiconductor wafer 120 in FIG. 2c. The active and passive components within semiconductor die 174 undergo testing at the wafer level for electrical performance and circuit function. Each semiconductor die 174 is tested for functionality and electrical parameters. The inspection and electrical testing of semiconductor wafer 170 enables semiconductor die 174 that pass to be designated as KGD for use in a semiconductor package.

In FIG. 3e, semiconductor wafer 170 is singulated through saw street 176 using a saw blade or laser cutting tool 189 into individual semiconductor die 174. The individual semiconductor die 174 can be inspected and electrically tested for identification of KGD post singulation.

FIG. 3f shows a plan view of active surface 180 of semiconductor die 174. Semiconductor die 174 includes various configurations of bumps 186 according to the design and function of the die, and bumps 186 may include active bumps 186a and dummy or support bumps 186b. Active surface 180 of semiconductor die 174 is electrically connected to active bumps 186a. Dummy bumps 186b provide structural support and increase the mechanical bonding strength of semiconductor die 174 to other devices. In one embodiment, bumps 186 are formed along the edges of semiconductor die 174 while active region 182 remains devoid of bumps 186. The configuration of bumps 186 shown in FIG. 3f illustrates active bumps 186a disposed along a first edge of semiconductor die 174 and dummy bumps 186b disposed along a second edge opposite the first edge. In one embodiment, dummy bumps 186b are formed in one or more corners of semiconductor die 174, and active bumps 186a are formed along an edge opposite to dummy bumps 186b.

FIGS. 4a-4b illustrate, in relation to FIG. 1, a method of prefabricating modular interconnect units from a substrate panel. FIG. 4a shows a cross-sectional view of a portion of a substrate panel 190. Substrate panel 190 includes core substrate 192 having opposing surfaces 194 and 196. Core substrate 192 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, core substrate 192 may include one or more insulating layers, passivation layers, or encapsulant.

A plurality of through vias is formed through a core substrate material 192 using laser drilling, mechanical drilling, deep reactive ion etching (DRIE), or other suitable process. The through vias extend completely through core substrate 192 from surface 194 to surface 196. The through vias are filled with Al, Cu, Sn, Ni, Au, Ag, titanium (Ti), tungsten (W), or other suitable electrically conductive material or combination thereof using PVD, CVD, electrolytic plating, electroless plating process, or other suitable metal deposition process to form z-direction vertical interconnect structures or conductive vias 198. Alternatively, a conductive layer is formed over the sidewalls of the through vias using PVD, CVD, electrolytic plating, electroless plating process, or other suitable metal deposition process, and a center portion of the through vias is filled with a conductive filler material, e.g., Cu paste, or an insulating filler material, e.g., a polymer plug. Vertical interconnect structures 198 may be formed prior to or after forming or depositing core substrate material 192. In one embodiment, vertical interconnect structures 198 include conductive columns, pillars, bumps, stud bumps, or other interconnect. An encapsulant is deposited around vertical interconnect structures 198 as core substrate 192 to embed vertical interconnect structures 198.

An electrically conductive layer 200 is formed over surface 194 of core substrate 192 and over conductive vias 198 using PVD, CVD, electrolytic plating, electroless plating process, or other suitable metal deposition process. Conductive layer 200 includes one or more layers of Al, Cu, Sn, Ni, Au, Ag, or other suitable electrically conductive material or combination thereof. Conductive layer 200 operates as contact pads electrically connected to conductive vias 198 or as redistribution layers (RDL) extending electrical connection from conductive vias 198 to areas adjacent to conductive vias 198. Conductive layer 200 laterally redistributes electrical signals across surface 194 of substrate panel 190. The portions of conductive layer 200 along surface 194 can be electrically common or electrically isolated depending on the routing design and function of the semiconductor package. Conductive layer 200 may be formed with traces or pads offset from conductive vias 198. In another embodiment, conductive layer 200 operates as a wire bondable pad or layer.

An electrically conductive layer 202 is formed over surface 196 of core substrate 192 and over conductive vias 198 using PVD, CVD, electrolytic plating, electroless plating process, or other suitable metal deposition process. Conductive layer 202 includes one or more layers of Al, Cu, Sn, Ni, Au, Ag, or other suitable electrically conductive material or combination thereof. Conductive layer 202 operates as contact pads electrically connected to conductive vias 198 or as RDLs extending electrical connection from conductive vias 198 to areas adjacent to conductive vias 198. Conductive layer 202 laterally redistributes electrical signals across surface 196 of substrate panel 190. The portions of conductive layer 202 along surface 196 can be electrically common or electrically isolated depending on the routing design and function of the semiconductor package. Conductive layer 202 may be formed with traces or pads offset from conductive vias 198. In one embodiment, conductive layer 202 operates as a wire bondable pad or layer.

In FIG. 4b, substrate panel 190 is singulated into individual modular interconnect structures or units 204 using saw blade or laser cutting tool 206. Modular interconnect units 204 are prefabricated from substrate panel 190 and are configured for integration into stacked semiconductor devices. In one embodiment, modular interconnect units 204 include an insulating material with conductive vias formed though the insulating material. In another embodiment, modular interconnect units 204 include conductive Cu pillars or columns embedded in an encapsulant. Modular interconnect units 204 may include additional conductive layers or insulating layers formed over surfaces 194 and 196 to provide additional electrical interconnect across the unit according to the design and functionality of the device. In one embodiment, passive devices are formed over surface 194 or 196 or are embedded within modular interconnect units 204. Conductive layers 200 and 202 may contain passive devices formed within the circuit layers.

Modular interconnect units 204 are prefabricated and provide a cost effective alternative for vertical interconnection in semiconductor packages. Modular interconnect units 204 are manufactured with lower cost materials and manufacturing technology. Use of modular interconnect units 204 for vertical interconnection decreases cycle time and increases manufacturing throughput. Modular interconnect units 204 also provide improved control over vertical interconnection. Thus, modular interconnect units 204 increase the design flexibility and improve the electrical performance and functionality of semiconductor packages, while decreasing cost and without increasing package thickness.

Figure 5B:
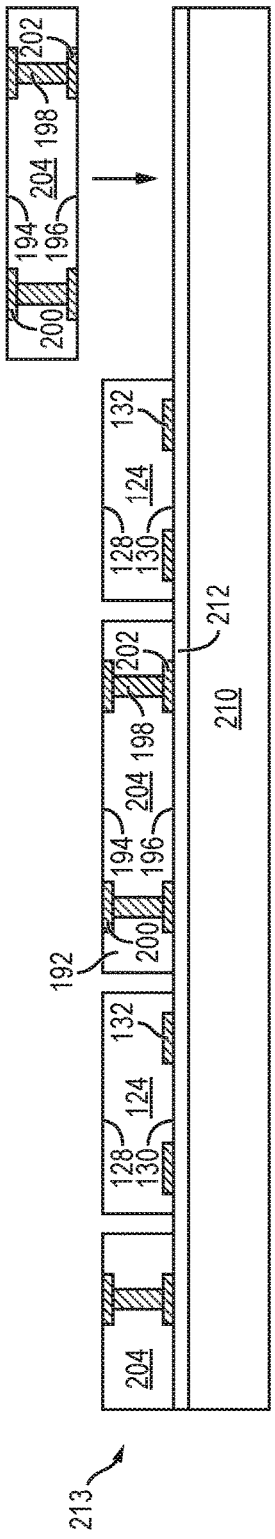

FIGS. 5a-5k illustrate, in relation to FIGS. 1, 2a-2d, 3a-3f, and 4a-4b, a method of making a semiconductor package including a MEMS semiconductor die mounted over an eWLB. FIG. 5a shows a cross-sectional view of a portion of a carrier or temporary substrate 210 containing sacrificial base material such as silicon, polymer, beryllium oxide, glass, or other suitable low-cost, rigid material for structural support. An interface layer or double-sided tape 212 is formed over carrier 210 as a temporary adhesive bonding film, etch-stop layer, or thermal release layer.

Carrier 210 can be a round or rectangular panel (greater than 300 mm) with capacity for multiple semiconductor die 124 and modular interconnect units 204. Carrier 210 may have a larger surface area than the surface area of semiconductor wafer 120. The number of semiconductor die 124 mounted to carrier 210 can be greater than the number of semiconductor die 124 singulated from semiconductor wafer 120. The larger surface area of carrier 210 accommodates more semiconductor die 124 and lowers manufacturing cost as more semiconductor die can be processed on the larger carrier thereby reducing the cost per unit. Semiconductor packaging and processing equipment is designed and configured for the size of the wafer or carrier being processed.

To further reduce manufacturing costs, the size of carrier 210 is selected independent of the size of semiconductor die 124 or size of semiconductor wafer 120. That is, carrier 210 has a fixed or standardized size, which can accommodate various size semiconductor die 124 singulated from one or more semiconductor wafers 120. In one embodiment, carrier 210 is circular with a diameter of 330 mm. In another embodiment, carrier 210 is rectangular with a width of 560 mm and length of 600 mm. Semiconductor die 124 may have dimensions of 0.8 mm by 1.25 mm, which are placed on the standardized carrier 210. Alternatively, semiconductor die 124 may have dimensions of 1.6 mm by 1.6 mm, which are placed on the same standardized carrier 210. Accordingly, standardized carrier 210 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 210 lowers manufacturing costs and capital risk by reducing or eliminating the need for specialized semiconductor processing lines based on die size or incoming wafer size. By selecting a predetermined carrier size to use for any size semiconductor die from all semiconductor wafer sizes, a flexible manufacturing line can be implemented.

Semiconductor die 124 from FIG. 2d are disposed over interface layer 212 and over carrier 210 using, for example, a pick and place operation with active surface 130 oriented toward the carrier. FIG. 5a shows semiconductor die 124 mounted to interface layer 212 of carrier 210 as reconstituted panel or reconfigured wafer 213. Reconstituted wafer or panel 213 can be processed into many types of semiconductor packages, including eWLB, fan-in WLCSP, reconstituted or embedded wafer level chip scale packages (eWLCSP), fan-out WLCSP, flipchip packages, 3D packages, package-on-package (PoP), or other semiconductor packages. Reconstituted panel 213 is configured according to the specifications of the resulting semiconductor package.

In FIG. 5b, modular interconnect units 204 are disposed over carrier 210 adjacent to semiconductor die 124 using, for example, a pick and place operation with surface 196 oriented toward the carrier. Modular interconnect units 204 are disposed on interface layer 212 in a peripheral region of semiconductor die 124. Modular interconnect units 204 are disposed within the semiconductor package at specific predetermined locations around semiconductor die 124 to optimize the space within the semiconductor package. When mounting modular interconnect units 204 adjacent to semiconductor die 124, a gap or space may remain between semiconductor die 124 and modular interconnect units 204. Modular interconnect units 204 provide vertical interconnect and increase flexibility of semiconductor package design. Because modular interconnect units 204 are prefabricated, use of modular interconnect units 204 for vertical interconnections reduces the manufacturing steps for the semiconductor package.

Modular interconnect units 204 are disposed adjacent to one or more sides of semiconductor die 124. In one embodiment, modular interconnect units 204 are disposed along two, three, or four sides of each semiconductor die 124. Modular interconnect units 204 contain multiple rows of conductive vias 198. Modular interconnect units 204 include square, rectangular, cross-shaped, angled or "L-shaped," or any geometrically-shaped footprint. Any number or configuration of modular interconnect units 204 are disposed adjacent to semiconductor die 124 depending on the routing design and function of the device.

Figure 5C:
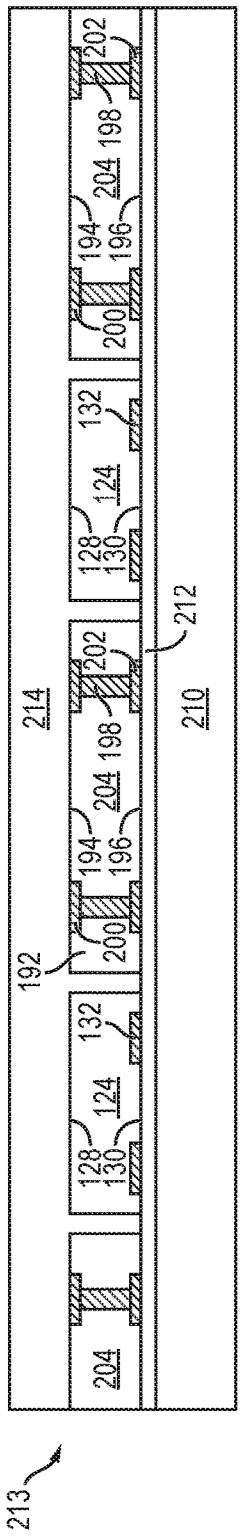

In FIG. 5c, an encapsulant or molding compound 214 is deposited over semiconductor die 124, modular interconnect units 204, and carrier 210 as an insulating material using a paste printing, compressive molding, transfer molding, liquid encapsulant molding, vacuum lamination, spin coating, or other suitable applicator. Encapsulant 214 includes polymer composite material, such as epoxy resin with filler, epoxy acrylate with filler, or polymer with proper filler. Encapsulant 214 is non-conductive and environmentally protects the semiconductor device from external elements and contaminants. Encapsulant 214 is deposited between and around semiconductor die 124 and modular interconnect units 204 to cover the side surfaces of semiconductor die 124 and modular interconnect units 204.

Figure 5D:
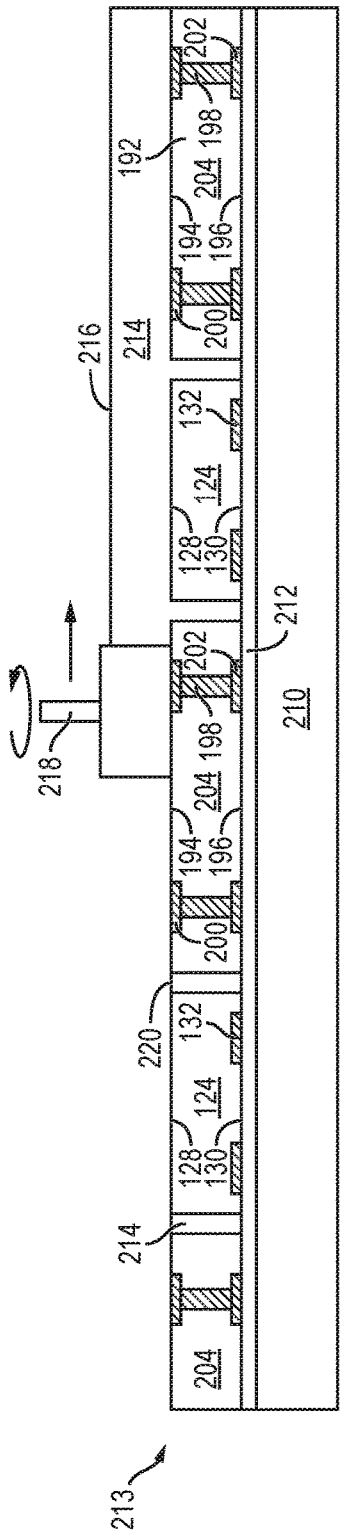
Figure 5E:
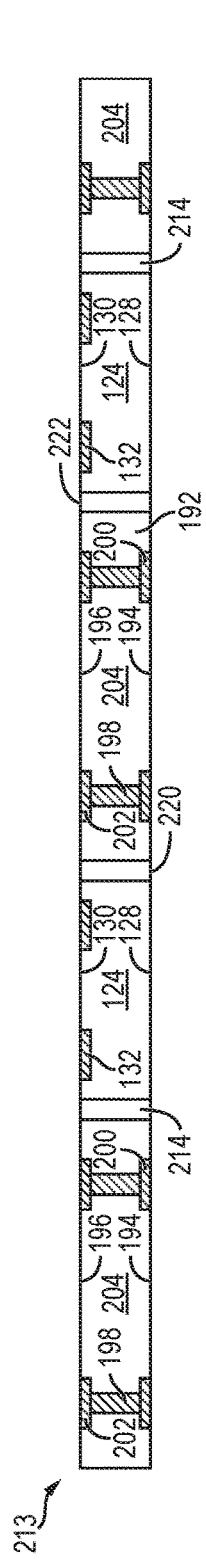

In FIG. 5d, a back surface 216 of encapsulant 214 undergoes an optional backgrinding operation with grinder 218 or other suitable mechanical or etching process to remove a portion of encapsulant 214. A backgrinding operation may completely remove encapsulant 214 from over semiconductor die 124 and modular interconnect units 204 exposing back surface 128 of semiconductor die 124 and surface 194 of modular interconnect units 204. A chemical etch, polishing, or CMP process can also be used to planarize encapsulant 214 and to remove mechanical damage resulting from the grinding operation. The removal of a portion of encapsulant 214 from back surface 216 leaves new back surface 220 of encapsulant 214. In one embodiment, surface 220 of encapsulant 214 is coplanar with back surface 128 of semiconductor die 124 and surface 194 of modular interconnect units 204. In another embodiment, encapsulant 214 remains covering back surface 128 of semiconductor die 124. In yet another embodiment, encapsulant 214 remains covering surface 194 of modular interconnect units 204, and a plurality of openings are formed in encapsulant 214 over and exposing conductive layer 200. FIG. 5e shows reconstituted panel 213 inverted with respect to the view in FIG. 5d.

In FIG. 5e, carrier 210 and interface layer 212 are removed by chemical etching, mechanical peel-off, chemical mechanical planarization (CMP), mechanical grinding, thermal bake, laser scanning, or wet stripping. Surface 196 of modular interconnect units 204, active surface 130 of semiconductor die 124, and surface 222 of encapsulant 214 are exposed after carrier 210 and interface layer 212 are removed. In one embodiment, surface 222 of encapsulant 214 is coplanar with active surface 130 of semiconductor die 124 and surface 196 of modular interconnect unit 204.

Figure 5F:
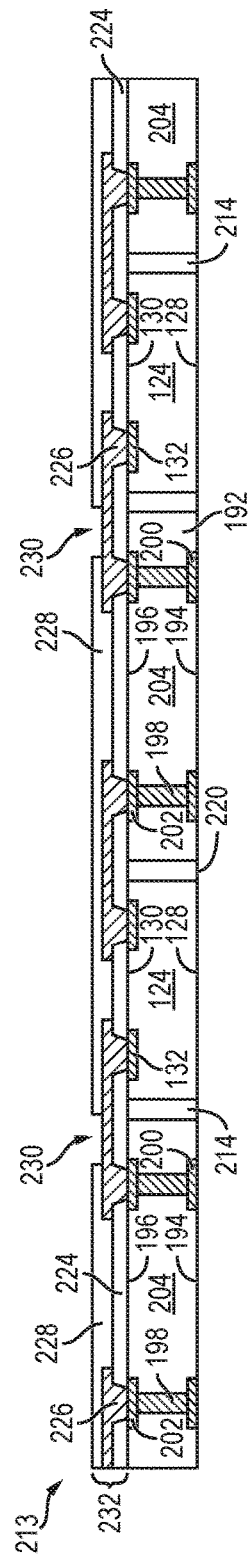

In FIG. 5f, an insulating or passivation layer 224 is formed over active surface 130 of semiconductor die 124, over surface 196 of modular interconnect units 204, and over surface 222 of encapsulant 214 using PVD, CVD, printing, spin coating, spray coating, sintering or thermal oxidation. Insulating layer 224 includes one or more layers of silicon dioxide (SiO2), silicon nitride (Si3N4), silicon oxynitride (SiON), tantalum pentoxide (Ta2O5), aluminum oxide (Al2O3), low temperature curable polymer dielectric resist (i.e., cures at less than 250° C.), benzocyclobutene (BCB), polybenzoxazoles (PBO), epoxy based photosensitive polymer dielectric, or other material having similar insulating and structural properties. A portion of insulating layer 224 is removed by laser direct ablation (LDA), etching, or other suitable process to expose conductive layers 132 and 202.

An electrically conductive layer 226 is formed over insulating layer 224, contact pads 132, and conductive layer 202 using a patterning and metal deposition process such as PVD, CVD, sputtering, electrolytic plating, and electroless plating. Conductive layer 226 includes one or more layers of Al, Cu, Ti, TiW, Sn, Ni, Au, Ag, W, or other suitable electrically conductive material or combination thereof. Conductive layer 226 operates as an RDL to redistribute electrical connection from semiconductor die 124 to outside a footprint of semiconductor die 124. One portion of conductive layer 226 is electrically connected to contact pads 132 of semiconductor die 124. Other portions of conductive layer 226 are electrically common or electrically isolated depending on the design and function of the semiconductor device. Conductive layer 226 electrically connects contact pads 132 of semiconductor die 124 to conductive vias 198 of modular interconnect units 204.

An insulating or passivation layer 228 is formed over insulating layer 224 and conductive layer 226 using PVD, CVD, printing, spin coating, spray coating, sintering or thermal oxidation. Insulating layer 228 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. A portion of insulating layer 228 is removed by LDA, etching, or other suitable process to form openings 230 to expose portions of conductive layer 226.

Insulating layers 224 and 228 together with conductive layer 226 form a build-up interconnect structure 232 formed over reconstituted panel 213 including over semiconductor die 124, modular interconnect units 204, and encapsulant 214. The number of insulating and conductive layers included within interconnect structure 232 depends on, and varies with, the complexity of the circuit routing design. Accordingly, interconnect structure 232 can include any number of insulating and conductive layers to facilitate electrical interconnect with respect to semiconductor die 124 and modular interconnect units 204. Reconstituted panel 213 is optionally singulated after forming interconnect structure 232.

An optional support tape, not shown, may be formed over reconstituted panel 213 for improved handling of the thinned reconstituted wafer. A support tape may include a thermally resistant tape, warpage balancing tape, thermal release layer, temporary adhesive bonding film, or other tape. Reconstituted wafer 213 with or without support tape may be disposed over an optional carrier or temporary substrate, such as a sacrificial base material or a supporting jig. Subsequent manufacturing steps can be performed with reconstituted panel 213 supported by a support tape and carrier or by a support tape or carrier.

Figure 5G:
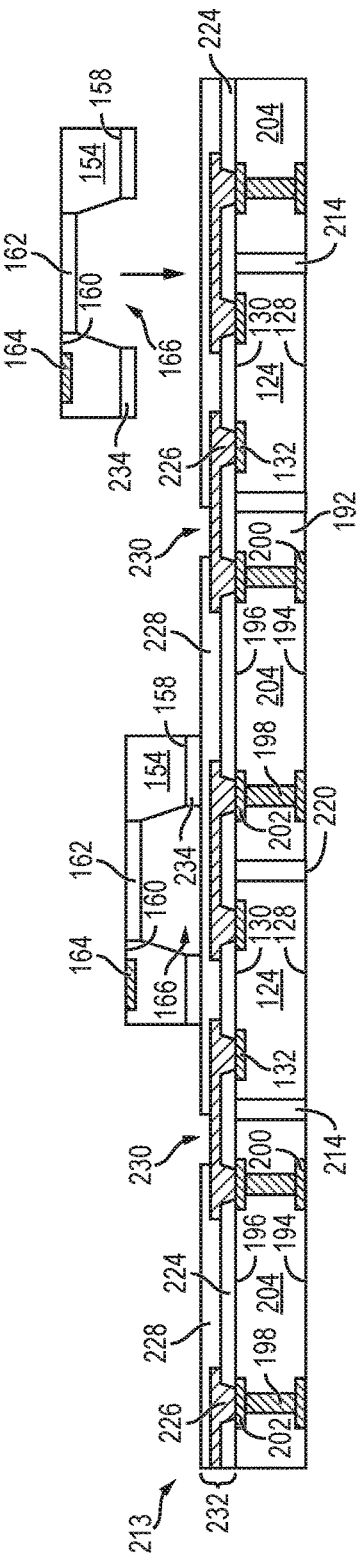

In FIG. 5g, semiconductor die 154 from FIG. 3b are disposed over and mounted to build-up interconnect structure 232 using, for example, a pick and place operation. In one embodiment, semiconductor die 154 are disposed with back surface 158 of semiconductor die 154 oriented toward semiconductor die 124 and modular interconnect units 204. Semiconductor die 154 are mounted to interconnect structure 232 with a die attach adhesive or film 234, such as epoxy resin. In another embodiment, die attach adhesive 234 includes a thermal interface material (TIM) such as thermal epoxy, thermal epoxy resin, thermal conductive paste, aluminum oxide, zinc oxide, boron nitride, pulverized silver, or thermal grease. Die attach adhesive 234 is cured to secure semiconductor die 154 to interconnect structure 232. In one embodiment, semiconductor die 154 are mounted to interconnect structure 232 at the reconstituted wafer-level or panel-level in a chip-on-wafer assembly. In another embodiment, reconstituted panel 213 is singulated prior to mounting semiconductor die 154. Semiconductor die 154 is a KGD having been tested prior to mounting to interconnect structure 232.

Figure 5H:
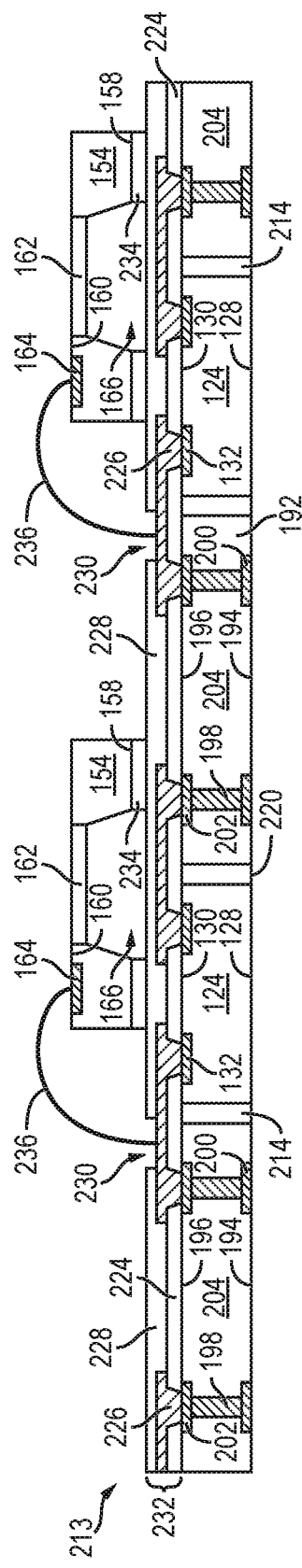

In FIG. 5h, a plurality of bond wires 236 is formed between interconnect structure 232 and semiconductor die 154. Bond wires 236 are mechanically and electrically coupled to conductive layer 226 of interconnect structure 232 and to contact pads 164 of semiconductor die 154 by thermocompression bonding, ultrasonic bonding, wedge bonding, stitch bonding, ball bonding, or other suitable bonding technique. Bond wires 236 include a conductive material such as Cu, Al, Au, Ag, metal alloy, or a combination thereof. Bond wires 236 electrically couple semiconductor die 154 to conductive layer 226, which is electrically coupled to semiconductor die 124 and modular interconnect units 204. Bond wires 236 represent one type of interconnect structure that electrically couples semiconductor die 154 to interconnect structure 232. In another embodiment, an electrically conductive layer, such as an RDL, is used instead of bond wires 236 to electrically couple semiconductor die 154 to interconnect structure 232.

Figure 5I:
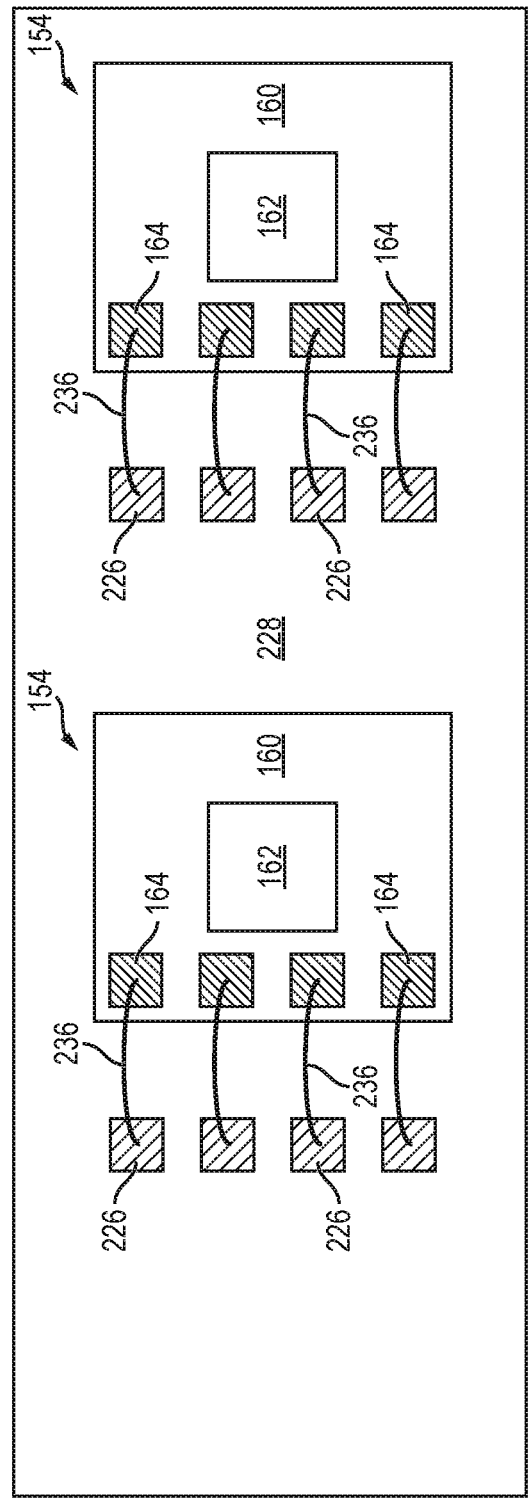

FIG. 5i shows a plan view of reconstituted panel 213. Semiconductor die 154 are disposed over insulating layer 228 of interconnect structure 232. Semiconductor die 154 are mounted with active surface 160 oriented in a direction away from semiconductor die 124 and modular interconnect units 204. Openings 230 in insulating layer 228 expose portions of conductive layer 226 for electrical interconnection. Bond wires 236 or other interconnect are formed between semiconductor die 154 and conductive layer 226. In one embodiment, semiconductor die 154 includes a length of 1.6 mm and a width of 0.8 mm. In another embodiment, semiconductor die 154 include dimensions or a footprint of 1.6 mm by 1.6 mm. A final package footprint may be 3.3 mm by 2.5 mm or less.

Figure 5J:
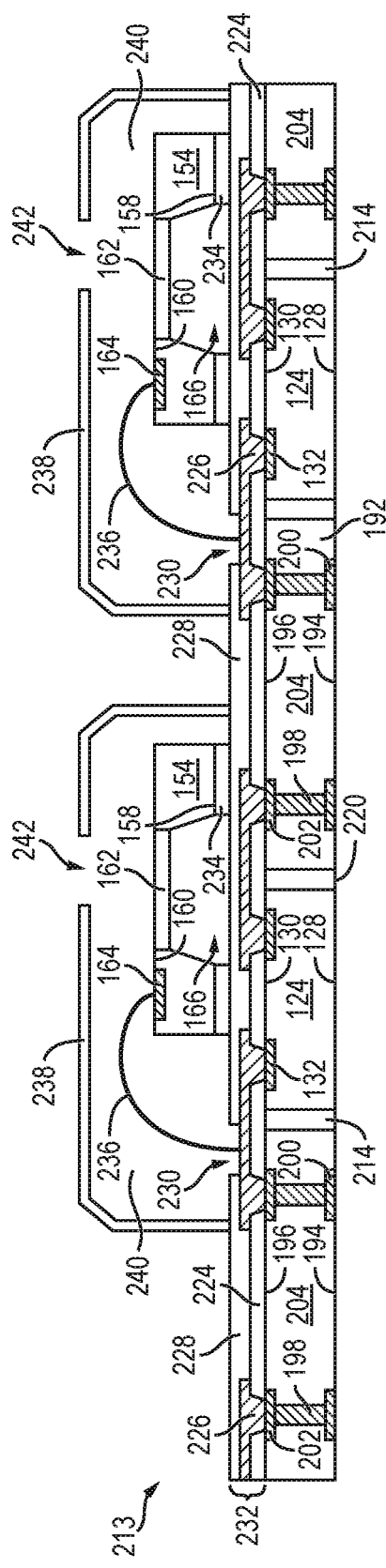

In FIG. 5j, a protective cover or lid 238 is mounted over semiconductor die 154 and bond wires 236 and over semiconductor die 124 and modular interconnect units 204. In one embodiment, lid 238 includes a metal having a low thermal conductivity or another material having low thermal conductivity. In another embodiment, lid 238 includes a sacrificial base material such as silicon, polymer, beryllium oxide, glass, or other suitable low-cost, rigid material. Alternatively, lid 238 operates as a heat spreader and includes Cu, Al, or other material with high thermal conductivity. In yet another embodiment, lid 238 operates as a shielding layer and includes Al, ferrite or carbonyl iron, stainless steel, nickel silver, low-carbon steel, silicon-iron steel, foil, conductive resin, or other metals and composites capable of blocking or absorbing electromagnetic interference (EMI), RF interference, harmonic distortion, and other inter-device interference.

Lid 238 is disposed over the individual semiconductor packages within reconstituted panel 213. Lid 238 is mounted to interconnect structure 232 using a suitable attachment or bonding process. In one embodiment, lid 238 is attached to interconnect structure 232 using an adhesive material, such as epoxy resin or thermal epoxy. The adhesive material is cured to secure lid 238 to insulating layer 228 or to another portion of reconstituted panel 213. In another embodiment, lid 238 is attached to conductive layer 226 of interconnect structure 232 using a bump material, such as Al, Sn, Ni, Au, Ag, Pb, Bi, Cu, solder, or combinations thereof. The bump material is reflowed by heating the material above its melting point to form balls or bumps. Lid 238 operates to protect active region 162 and active surface 160 of semiconductor die 154 as well as bond wires 236. Lid 238 forms a chamber or relief area 240 over semiconductor die 154.

Lid 238 includes an optional opening 242 formed through lid 238. The shape and position of the opening 242 may be selected for acoustic effect or other design considerations. In one embodiment, opening 242 is disposed directly over active region 162 and operates as an acoustic port by permitting sound waves to enter through opening 242. Chamber 240 formed by lid 238 further operates as an acoustic chamber for a MEMS microphone. In a MEMS microphone embodiment, chamber 240 may operate as a front chamber, and cavity 166 in semiconductor die 154 may operate as a back chamber. The shape and size of chamber 240 is selected for improved acoustic performance, such as to prevent resonance. Active region 162 may include a diaphragm sensitive to changes in air pressure, for example, caused by sound waves. Sound waves enter through opening 242 in lid 238, and active region 162 responds to the changes in air pressure caused by the sound waves.

Figure 5K:
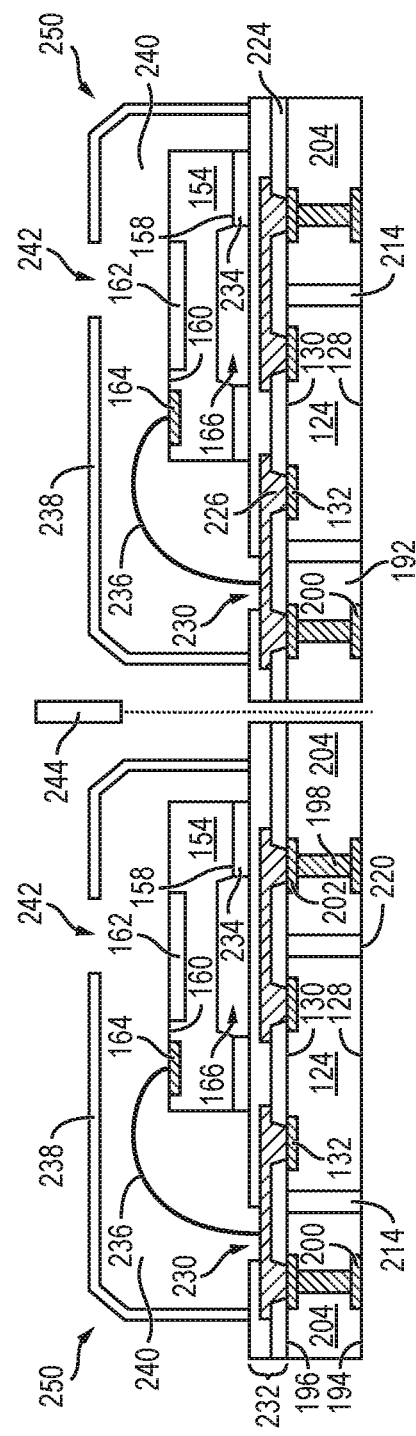

In FIG. 5k, reconstituted panel 213 is singulated with saw blade or laser cutting device 244 through interconnect structure 232 and modular interconnect units 204 into individual semiconductor devices or eWLB packages 250. In another embodiment, reconstituted panel 213 is singulated prior to mounting semiconductor die 154 and lid 238 over semiconductor die 124 and modular interconnect units 204.

FIG. 6 shows an eWLB package 250 after singulation. eWLB package 250 includes a wire bonded semiconductor die 154 stacked over an eWLB structure including a semiconductor die 124 and modular interconnect unit 204 embedded in encapsulant 214. Interconnect structure 232 is formed over semiconductor die 124, encapsulant 214, and modular interconnect units 204 to extend electrical interconnection of semiconductor die 124 to outside a footprint of the die. Interconnect structure 232 includes insulating layers 224 and 228, conductive layer 226, and may include fewer or additional conductive and insulating layers. Semiconductor die 154 is mounted to build-up interconnect structure 232 with die attach adhesive 234. Semiconductor die 154 is electrically connected to semiconductor die 124 and modular interconnect units 204 through bond wires 236 and interconnect structure 232. eWLB package 250 may electrically connect to external devices through modular interconnect units 204. In one embodiment, semiconductor die 124 includes an ASIC, and semiconductor die 154 includes a MEMS or other active or passive sensors responsive to various external stimuli.

Semiconductor die 154 is stacked over semiconductor die 124 and modular interconnect units 204 thereby decreasing the overall size and footprint of eWLB package 250. The stacked design of eWLB package 250 provides a reduced package footprint compared to packages having semiconductor die mounted side-by-side, because a footprint of semiconductor die 154 overlaps semiconductor die 124. In one embodiment, semiconductor die 154 includes dimensions of 1.6 mm by 0.8 mm or 1.6 mm by 1.6 mm, and semiconductor die 124 includes dimensions of 0.8 mm by 1.25 mm. The design of eWLB package 250 results in a reduced package size having footprint dimensions of approximately 3.3 mm by 2.5 mm or less. Use of prefabricated modular interconnect units 204 reduces the cost of forming vertical interconnections within eWLB package 250. Additionally, eWLB package 250 is processed as a reconstituted panel 213 on standardized carrier 210. Therefore, eWLB package 250 is manufactured using standardized processing tools, equipment, and bill of materials, thereby further reducing the cost to manufacture eWLB package 250.

Figure 7C:
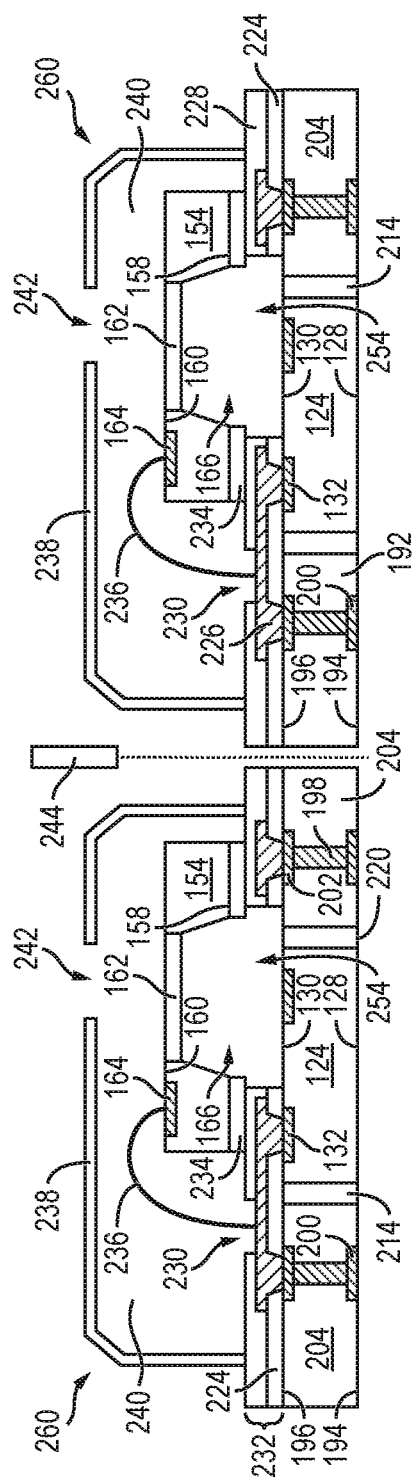

FIGS. 7a-7c illustrate, in relation to FIGS. 1, 2a-2d, 3a-3c, 4a-4b, and 5a-5f, a method of making a semiconductor package including a MEMS semiconductor die mounted over an eWLB structure with a larger back chamber. Continuing from FIG. 5e, FIG. 7a shows reconstituted panel 213 including interconnect structure 232 formed with an opening or non-routing area 252. Interconnect structure 232 includes insulating layers 224 and 228 and conductive layers 226 formed over reconstituted panel 213 using a process similar to the process described with respect to FIG. 5f. In FIG. 7a, interconnect structure 232 is formed over semiconductor die 124, modular interconnect units 204, and encapsulant 214 while non-routing area 252 remains devoid of interconnect structure 232. Alternatively, a portion of insulating layers 224 and 228 and conductive layer 226 is removed to form opening 252. Opening 252 is devoid of insulating layers 224 and 228 and conductive layer 226. The size and position of opening 252 is selected according to the design of the semiconductor device to be subsequently mounted over opening 252. The number of insulating and conductive layers included within interconnect structure 232 depends on, and varies with, the complexity of the circuit routing design. Accordingly, interconnect structure 232 can include any number of insulating and conductive layers to facilitate electrical interconnect with respect to semiconductor die 124 and modular interconnect units 204.

In FIG. 7b, semiconductor die 154 are disposed over and mounted to build-up interconnect structure 232 using, for example, a pick and place operation. Semiconductor die 154 are mounted to interconnect structure 232 with die attach adhesive 234. In one embodiment, semiconductor die 154 are mounted to interconnect structure 232 at the reconstituted wafer-level or panel-level in a chip-on-wafer assembly. In another embodiment, reconstituted panel 213 is singulated prior to mounting semiconductor die 154. Semiconductor die 154 is a KGD having been tested prior to mounting to interconnect structure 232.

In one embodiment, semiconductor die 154 are disposed with back surface 158 of semiconductor die 154 oriented toward semiconductor die 124 and modular interconnect units 204. Semiconductor die 154 is positioned with cavity 166 disposed over opening 252 in interconnect structure 232. Cavity 166 disposed over opening 252 forms a chamber 254 over the backside of semiconductor die 154 and active region 162. Chamber 254 is larger than cavity 166 alone, thereby increasing the space between active region 162 of semiconductor die 154 and the bottom package with semiconductor die 124. The shape and size of chamber 254 is selected for improved acoustic performance of a MEMS microphone. In one embodiment, the larger size of chamber 254 improves the performance of semiconductor die 154 as a MEMS microphone.

A plurality of bond wires 236 is formed between interconnect structure 232 and semiconductor die 154. Bond wires 236 are mechanically and electrically coupled to conductive layer 226 of interconnect structure 232 and to contact pads 164 of semiconductor die 154 by thermocompression bonding, ultrasonic bonding, wedge bonding, stitch bonding, ball bonding, or other suitable bonding technique. Bond wires 236 include a conductive material such as Cu, Al, Au, Ag, metal alloy, or a combination thereof. Bond wires 236 electrically couple semiconductor die 154 to conductive layer 226, which is electrically coupled to semiconductor die 124 and modular interconnect units 204. Bond wires 236 represent one type of interconnect structure that electrically couples semiconductor die 154 to interconnect structure 232. In another embodiment, an electrically conductive layer, such as an RDL, is used instead of bond wires 236 to electrically couple semiconductor die 154 to interconnect structure 232.

In FIG. 7c, a protective cover or lid 238 is mounted over semiconductor die 154 and bond wires 236 and over semiconductor die 124 and modular interconnect units 204. Lid 238 is disposed over the individual semiconductor packages within reconstituted panel 213. Lid 238 is mounted to interconnect structure 232 using a suitable attachment or bonding process. In one embodiment, lid 238 is attached to interconnect structure 232 using an adhesive material, such as epoxy resin or thermal epoxy. The adhesive material is cured to secure lid 238 to insulating layer 228 or to another portion of reconstituted panel 213. In another embodiment, lid 238 is attached to conductive layer 226 of interconnect structure 232 using a bump material, such as Al, Sn, Ni, Au, Ag, Pb, Bi, Cu, solder, or combinations thereof. The bump material is reflowed by heating the material above its melting point to form balls or bumps. Lid 238 operates to protect active region 162 and active surface 160 of semiconductor die 154 as well as bond wires 236. Lid 238 forms a chamber or relief area 240 over semiconductor die 154.

Lid 238 includes an optional opening 242 formed through lid 238. The shape and position of the opening 242 may be selected for acoustic effect or other design considerations. In one embodiment, opening 242 is disposed directly over active region 162 and operates as an acoustic port by permitting sound waves to enter through opening 242. Chamber 240 formed by lid 238 further operates as an acoustic chamber for a MEMS microphone. In a MEMS microphone embodiment, chamber 240 may operate as a front chamber, and chamber 254 may operate as a back chamber. The shape and size of chamber 240 is selected for improved acoustic performance, such as to prevent resonance. Active region 162 may include a diaphragm sensitive to changes in air pressure, for example, caused by sound waves. Sound waves enter through opening 242 in lid 238, and active region 162 responds to the changes in air pressure caused by the sound waves.

Reconstituted panel 213 is singulated with saw blade or laser cutting device 244 through build-up interconnect structure 232 and modular interconnect units 204 into individual semiconductor devices or eWLB packages 260. In another embodiment, reconstituted panel 213 is singulated prior to mounting semiconductor die 154 and lid 238 over semiconductor die 124 and modular interconnect units 204.

Figure 8:
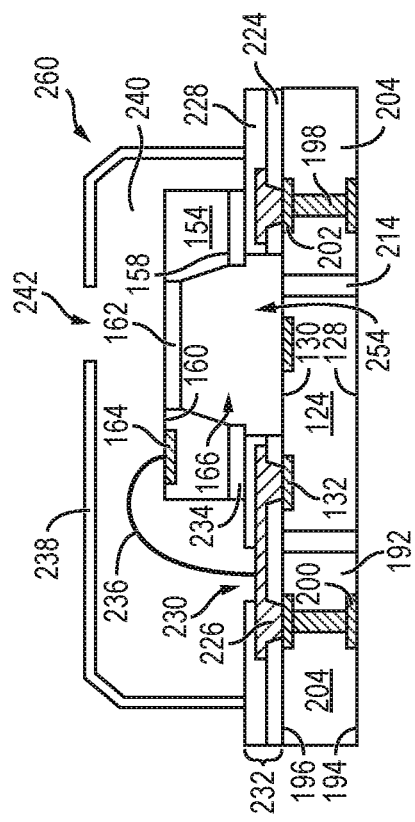
FIG. 8 illustrates a MEMS package including a MEMS semiconductor die mounted over an eWLB with a chamber under the MEMS semiconductor die.

FIG. 8 shows eWLB package 260 including a wire bonded semiconductor die 154 stacked over a bottom eWLB structure including a semiconductor die 124 and modular interconnect unit 204 embedded in encapsulant 214. Interconnect structure 232 is formed over semiconductor die 124, encapsulant 214, and modular interconnect units 204 to extend electrical interconnection of semiconductor die 124 to outside a footprint of the die. Interconnect structure 232 includes insulating layers 224 and 228, conductive layer 226, and may include fewer or additional conductive and insulating layers. Semiconductor die 154 is mounted to build-up interconnect structure 232 with die attach adhesive 234. Semiconductor die 154 is electrically connected to semiconductor die 124 and modular interconnect units 204 through bond wires 236 and interconnect structure 232. eWLB package 260 may electrically connect to external devices through modular interconnect units 204. In one embodiment, semiconductor die 124 includes an ASIC, and semiconductor die 154 includes a MEMS or other active or passive sensors responsive to various external stimuli. Interconnect structure 232 is formed with a non-routing area. Cavity 166 of semiconductor die 154 is positioned over the non-routing area of interconnect structure 232 to form chamber 254 having a larger size than, for example, chamber 166 of eWLB package 250 from FIG. 6. The larger size of chamber 254 of eWLB package 260 improves the performance of semiconductor die 154 as a MEMS microphone.

Semiconductor die 154 is stacked over semiconductor die 124 and modular interconnect units 204 thereby decreasing the overall size and footprint of eWLB package 260. The stacked design of eWLB package 260 provides a reduced package footprint compared to packages having semiconductor die mounted side-by-side, because a footprint of semiconductor die 154 overlaps semiconductor die 124. In one embodiment, semiconductor die 154 includes dimensions of 1.6 mm by 0.8 mm or 1.6 mm by 1.6 mm, and semiconductor die 124 includes dimensions of 0.8 mm by 1.25 mm. The design of eWLB package 260 results in a reduced package size having footprint dimensions of approximately 3.3 mm by 2.5 mm or less. Use of prefabricated modular interconnect units 204 reduces the cost of forming vertical interconnections within eWLB package 260. Additionally, eWLB package 260 is processed as a reconstituted panel 213 on standardized carrier 210. Therefore, eWLB package 260 is manufactured using standardized processing tools, equipment, and bill of materials, thereby further reducing the cost to manufacture eWLB package 260.

FIGS. 9a-9b illustrate, in relation to FIGS. 1, 2a-2d, 3d-3f, 4a-4b, and 5a-5f, a method of making a semiconductor package including a flipchip MEMS semiconductor die mounted over an eWLB device. Continuing from FIG. 5f, FIG. 9a shows reconstituted panel 213 including build-up interconnect structure 232 formed with openings 230 in insulating layer 228. Openings 230 are positioned in a die attach area. Semiconductor die 174 from FIGS. 3d-3f are mounted to reconstituted panel 213 using a pick and place operation with active surface 180 and conductive layer 184 oriented toward build-up interconnect structure 232. Bumps 186 bonded to conductive layer 226 using a suitable attachment or bonding process. In one embodiment, the bump material is reflowed by heating the material above its melting point to metallurgically and electrically connect to conductive layer 226. In some applications, bumps 186 are reflowed a second time to improve electrical contact to conductive layer 184 or 226. Bumps 186 can also be compression bonded or thermocompression bonded to conductive layer 184 or 226. Bumps 186 represent one type of interconnect structure that can be formed over conductive layer 184 or 226. The interconnect structure can also use bond wires, conductive paste, stud bump, micro bump, Cu columns, pillars, or other electrical interconnect. Semiconductor die 174 are electrically connected through conductive layers 184 and bumps 186 to conductive layer 226 of interconnect structure 232 and through interconnect structure 232 to modular interconnect units 204 and semiconductor die 124. In one embodiment, bumps 186 provide a standoff height with a space or area 262 between active region 182 and interconnect structure 232. Interconnect structure 232 may further include a non-routing area, as described with respect to FIGS. 7a-7c. Active region 182 may be positioned over a non-routing area of interconnect structure 232 to further increase the space 262 between active region 182 and the lower package structure.

FIG. 9b shows semiconductor die 174 mounted to interconnect structure 232 over reconstituted panel 213. A protective cover or lid 238 is mounted over semiconductor die 174, semiconductor die 124, and modular interconnect units 204. Lid 238 is disposed over the individual semiconductor packages within reconstituted panel 213. Lid 238 is mounted to interconnect structure 232 using a suitable attachment or bonding process. In one embodiment, lid 238 is attached to interconnect structure 232 using an adhesive material, such as epoxy resin or thermal epoxy. The adhesive material is cured to secure lid 238 to insulating layer 228 or to another portion of reconstituted panel 213. In another embodiment, lid 238 is attached to conductive layer 226 of interconnect structure 232 using a bump material, such as Al, Sn, Ni, Au, Ag, Pb, Bi, Cu, solder, or combinations thereof. The bump material is reflowed by heating the material above its melting point to form balls or bumps. Lid 238 operates to protect active region 182 and active surface 180 of semiconductor die 174. Lid 238 forms a chamber or relief area 240 over semiconductor die 174.

Lid 238 includes an optional opening 242 formed through lid 238. The shape and position of the opening 242 may be selected for acoustic effect or other design considerations. In one embodiment, opening 242 is disposed directly over active region 182 and operates as an acoustic port by permitting sound waves to enter through opening 242. Chamber 240 formed by lid 238 further operates as an acoustic chamber for a MEMS microphone. In a MEMS microphone embodiment, chamber 240 may operate as a front chamber, and area 262 may operate as a back chamber. The shape and size of chamber 240 is selected for improved acoustic performance, such as to prevent resonance. Active region 182 may include a diaphragm sensitive to changes in air pressure, for example, caused by sound waves. Sound waves enter through opening 242 in lid 238, and active region 182 responds to the changes in air pressure caused by the sound waves.

Reconstituted panel 213 is singulated with saw blade or laser cutting device 264 through build-up interconnect structure 232 and modular interconnect units 204 into individual semiconductor devices or eWLB packages 270. In another embodiment, reconstituted panel 213 is singulated prior to mounting semiconductor die 174 and lid 238 over semiconductor die 124 and modular interconnect units 204.

Figure 10:
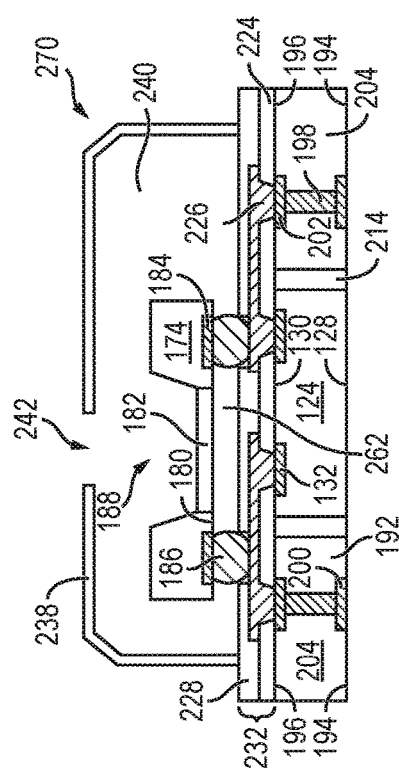
FIG. 10 illustrates a MEMS package including a flipchip MEMS semiconductor die mounted over an eWLB.

FIG. 10 shows an eWLB package 270 after singulation. eWLB package 270 includes semiconductor die 174 flip chip mounted over an eWLB semiconductor die 124 and modular interconnect unit 204. Build-up interconnect structure 232 is formed over semiconductor die 124, encapsulant 214, and modular interconnect units 204 to extend electrical interconnection of semiconductor die 124 to outside a footprint of the die. Build-up interconnect structure 232 includes insulating layers 224 and 228, conductive layer 226, and may include fewer or additional conductive and insulating layers. Semiconductor die 174 is electrically connected to semiconductor die 124 and modular interconnect units 204 through bumps 186 and interconnect structure 232. eWLB package 270 may electrically connect to external devices through modular interconnect units 204. In one embodiment, semiconductor die 124 includes an ASIC, and semiconductor die 174 includes a MEMS or other active or passive sensors responsive to various external stimuli.

Semiconductor die 174 is stacked over semiconductor die 124 and modular interconnect units 204 thereby decreasing the overall size and footprint of eWLB package 270. The stacked design of eWLB package 270 provides a reduced package footprint compared to packages having semiconductor die mounted side-by-side, because a footprint of semiconductor die 174 overlaps semiconductor die 124. Additionally, bumps 186 provide a more compact electrical interconnection of semiconductor die 174 to semiconductor die 124, because bumps 186 are disposed directly below and within a footprint of semiconductor die 174 rather than being adjacent to or lateral to semiconductor die 174. Thus, bumps 186 further reduce the footprint of eWLB package 270, compared to a side-by-side or wire bonded die. In one embodiment, semiconductor die 174 includes dimensions of 1.6 mm by 0.8 mm or 1.6 mm by 1.6 mm, and semiconductor die 124 includes dimensions of 0.8 mm by 1.25 mm. The design of eWLB package 270 results in a reduced package size having footprint dimensions of approximately 3.3 mm by 2.5 mm or less. Use of prefabricated modular interconnect units 204 reduces the cost of forming vertical interconnections within eWLB package 270. Additionally, eWLB package 270 is processed as a reconstituted panel 213 on standardized carrier 210. Therefore, eWLB package 270 is manufactured using standardized processing tools, equipment, and bill of materials, thereby further reducing the cost to manufacture eWLB package 270.

Figure 11A:
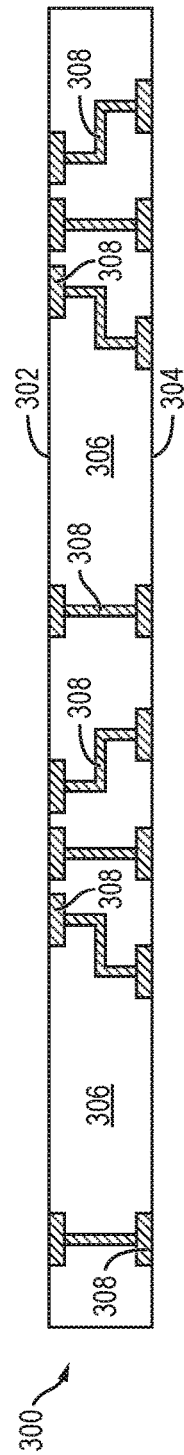
FIGS. 11a-11h illustrate a method of forming a MEMS package including a MEMS semiconductor die and flipchip semiconductor die mounted over a substrate.

FIGS. 11*a*-11*h* illustrate, in relation to FIGS. 1, 2*a*-2*d*, and 3*a*-3*f*, a method of making a MEMS package including a plurality of semiconductor die mounted over a substrate. FIG. 11*a* shows a cross-sectional view of a portion of a substrate or interposer panel 300 having opposing surfaces 302 and 304. Substrate 300 includes an insulating material 306 and one or more conductive layers 308. Insulating material 306 can include a multilayer structure comprising an organic substrate core, prepreg, and solder mask material with resin, filler, and/or glass fiber. Conductive layers 308 can include multiple layers of metal, e.g., Cu, sandwiched or disposed between the various layers of insulating material 306. The various metal layers 308 are patterned and electrically connected according to the interconnection design and function of the semiconductor die subsequently mounted to substrate 300 and the final semiconductor package. In one embodiment, substrate 300 contains one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Substrate 300 can be laminate based, thin flexible circuit based, ceramic, copper foil, glass, and may include a semiconductor wafer with an active surface containing one or more transistors, diodes, and other circuit elements to implement analog circuits or digital circuits.

Insulating material 306 is formed using PVD, CVD, printing, lamination, spin coating, spray coating, sintering, or thermal oxidation. Insulating material 306 contains one or more layers of SiO2, Si3N4, SiON, Ta2O5, Al2O3, or other material having similar insulating and structural properties. In one embodiment, one of the layers of insulating material 306 is formed using bismaleimide triazine (BT) resin with glass fiber and silica fillers and another layer of insulating material 306 at surface 302 or 304 of substrate 300 is formed using a solder mask material.

Conductive layers 308 of substrate 300 are formed using a patterning and metal deposition process such as sputtering, electrolytic plating, metal foil lamination, chemical etching back, or electroless plating. Conductive layers 308 can be one or more layers of Al, Cu, Sn, Ni, Au, Ag, Ti, TiW, W, or other suitable electrically conductive material. Conductive layers 308 include lateral RDL and vertical conductive vias to provide electrical interconnect through substrate 300. Portions of conductive layers 308 are electrically common or electrically isolated according to the design and function of the semiconductor die to be mounted to substrate 300.

Figure 11B:
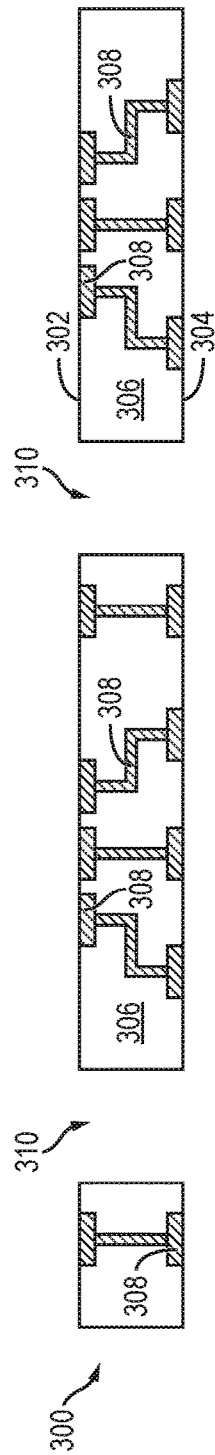

In FIG. 11*b*, one or more openings 310 formed through substrate 300. Openings 310 extend completely through substrate 300 from surface 302 to surface 304. Openings 310 may be formed in an area of substrate 300 over which a semiconductor die is subsequently mounted. Openings 310 are devoid of any material and allows stimuli, e.g., light or sound, to pass through substrate 300 and reach sensors on the active surface of the subsequently mounted semiconductor die.

Figure 11C:
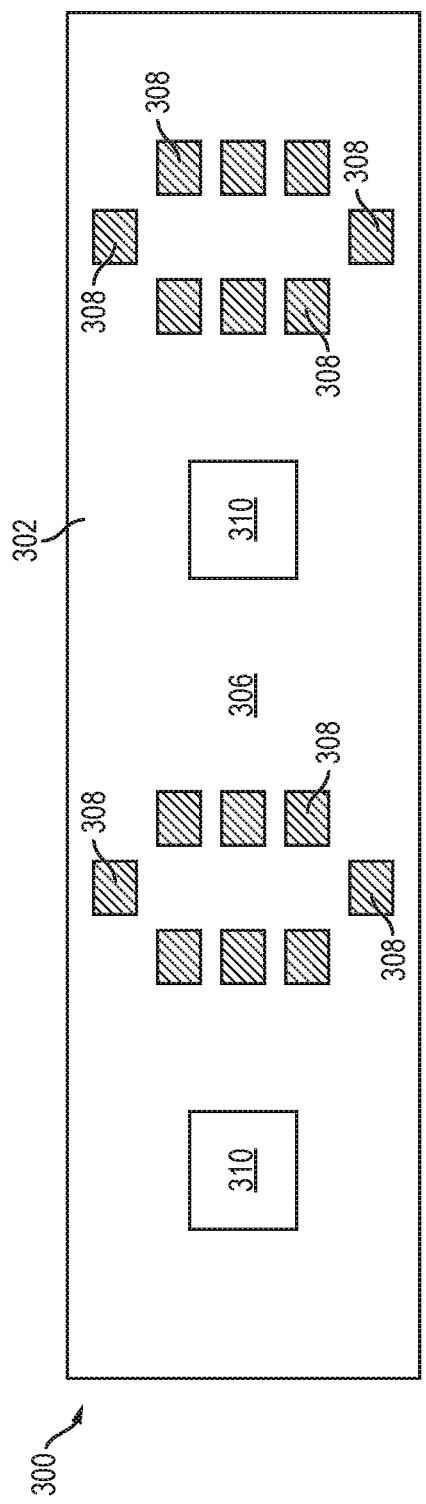

FIG. 11*c* shows a plan view of an exemplary layout of substrate 300, openings 310, and electrical interconnections 308 on surface 302 of substrate 300. In FIG. 11*c*, a single opening 310 is formed in each package area or die-attach area of substrate 300. Additional layouts of openings 310 through substrate 300 are possible without departing from the scope of the present invention. Conductive layer 308 is formed on surface 302 of substrate 300 as contact pads 308 for subsequently mounted semiconductor die.

Figure 11D:
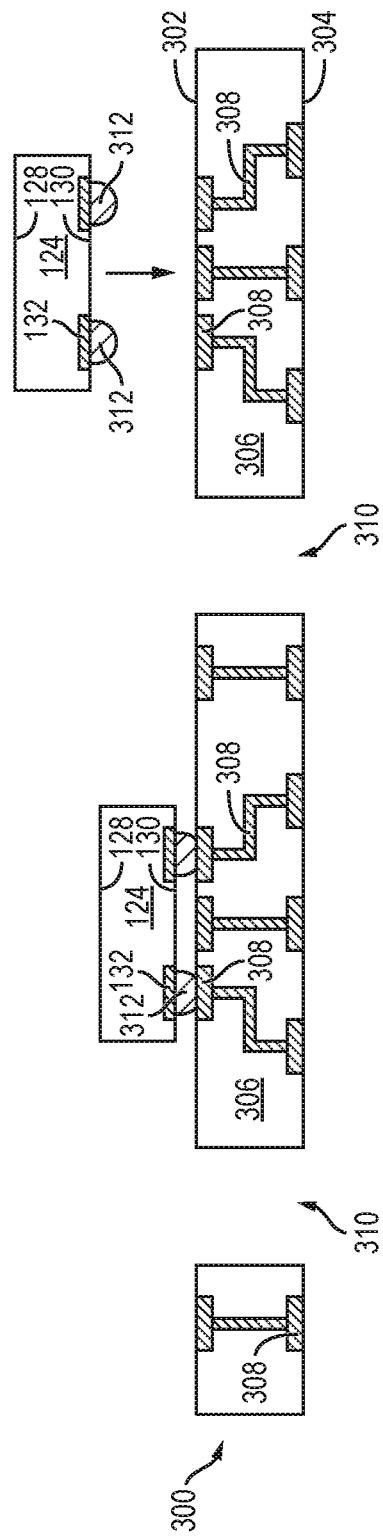

In FIG. 11d, semiconductor die 124 from FIG. 2d are disposed over and mounted to substrate 300 using, for example, a pick and place operation with active surface 130 oriented toward substrate 300. Semiconductor die 124 is a KGD having been tested prior to mounting semiconductor die 124 to substrate 300. An electrically conductive bump material is deposited over conductive layer 132 of semiconductor die 124 or conductive layer 308 of substrate 300 prior to mounting semiconductor die 124. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 132 or 308 using a suitable attachment or bonding process. In one embodiment, the bump material is reflowed by heating the material above its melting point to form spherical balls or bumps 312. In some applications, bumps 312 are reflowed a second time to improve electrical contact to conductive layers 132 and 308. The bumps can also be compression bonded to conductive layers 132 and 308. Bumps 312 represent one type of interconnect structure that is formed over conductive layer 132 or 308. The interconnect structure can also use bond wires, stud bump, micro bump, or other electrical interconnect.

Figure 11E:
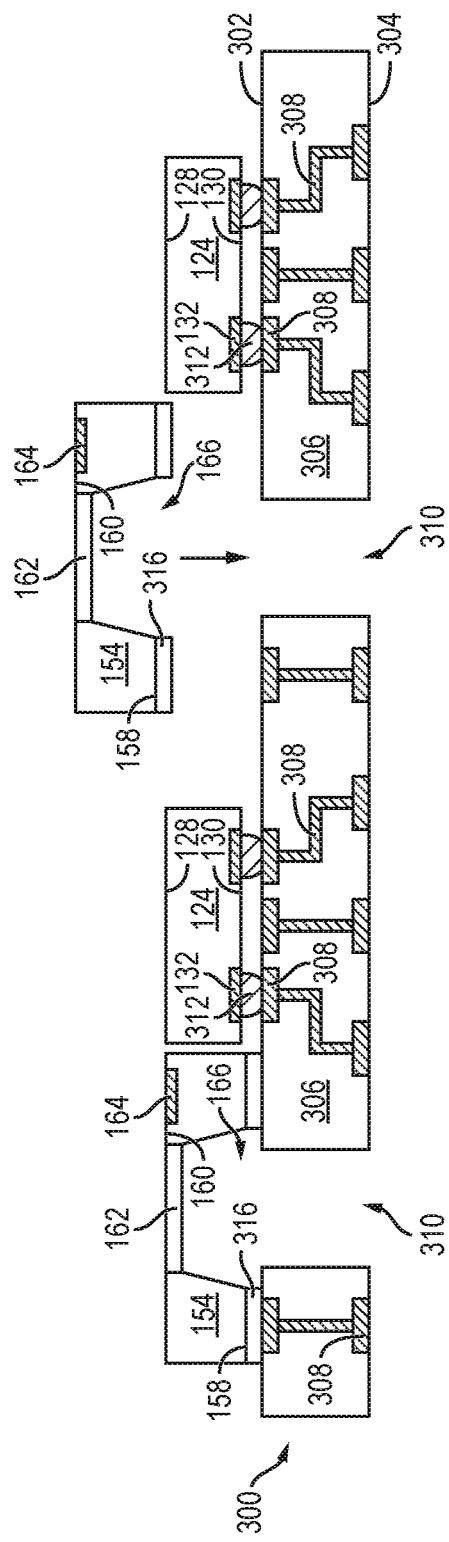

In FIG. 11e, semiconductor die 154 from FIG. 3b are disposed over and mounted to substrate 300 using, for example, a pick and place operation. Semiconductor die 154 are positioned with cavity 166 disposed over opening 310 in substrate 300. In one embodiment, semiconductor die 154 are disposed with back surface 158 of semiconductor die 154 oriented toward substrate 300. Semiconductor die 154 are mounted to substrate 300 with a die attach adhesive or film 316, such as epoxy resin. In another embodiment, die attach adhesive 316 includes a TIM such as thermal epoxy, thermal epoxy resin, thermal conductive paste, aluminum oxide, zinc oxide, boron nitride, pulverized silver, or thermal grease. Die attach adhesive 316 is cured to secure semiconductor die 154 to substrate 300. In one embodiment, semiconductor die 154 are mounted to substrate 300 at the wafer-level or panel-level in a chip-on-wafer assembly. In another embodiment, substrate 300 is singulated prior to mounting semiconductor die 154. Semiconductor die 154 is a KGD having been tested prior to mounting to substrate 300.

Figure 11F:
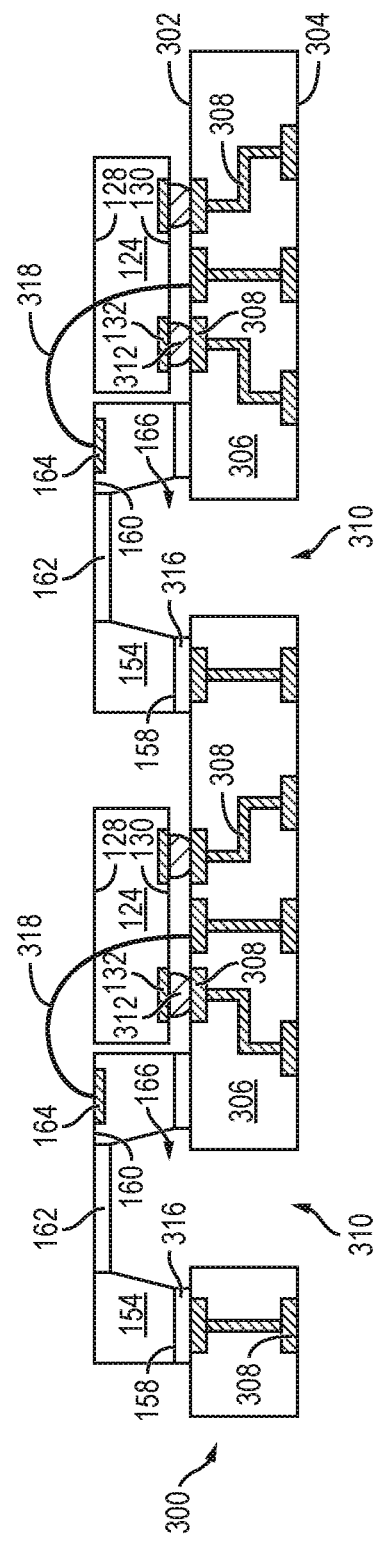

In FIG. 11f, a plurality of bond wires 318 is formed between substrate 300 and semiconductor die 154. Bond wires 318 are mechanically and electrically coupled to conductive layer 308 of substrate 300 and to contact pads 164 of semiconductor die 154 by thermocompression bonding, ultrasonic bonding, wedge bonding, stitch bonding, ball bonding, or other suitable bonding technique. Bond wires 318 include a conductive material such as Cu, Al, Au, Ag, metal alloy, or a combination thereof. Bond wires 318 electrically couple semiconductor die 154 to conductive layer 308, which is electrically coupled to semiconductor die 124. Bond wires 318 represent one type of interconnect structure that electrically couples semiconductor die 154 to substrate 300. In another embodiment, an electrically conductive layer, such as an RDL, or bumps are used instead of bond wires 318 to electrically couple semiconductor die 154 to substrate 300.

Figure 11G:
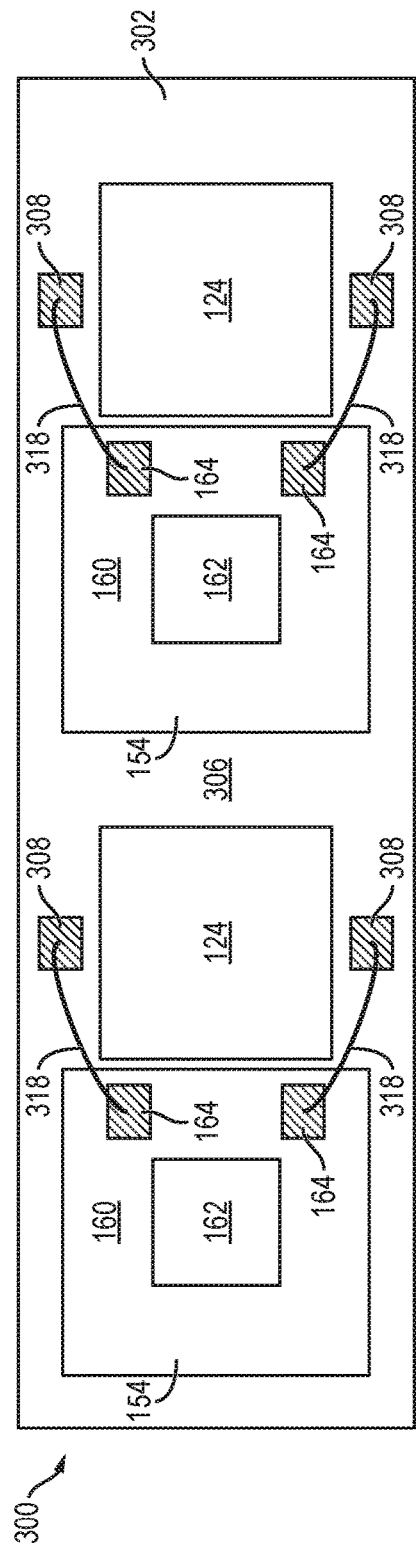
Figure 11H:
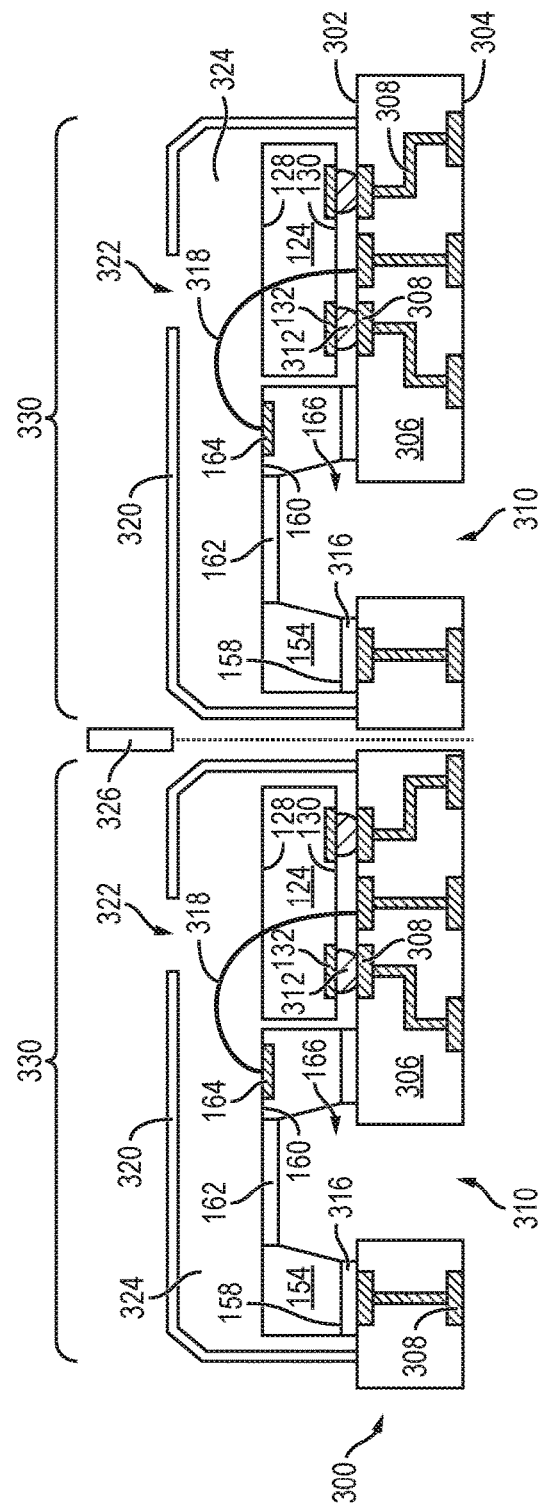

FIG. 11g shows a plan view of substrate 300 with semiconductor die 154 and 124 disposed over surface 302 of substrate 300. Semiconductor die 154 are mounted with active surface 160 oriented in a direction away from substrate 300. Semiconductor die 124 are mounted with active surface 130 oriented in a direction toward from substrate 300. Semiconductor die 124 and 154 are disposed side-by-side, with semiconductor die 124 adjacent to semiconductor die 154. Bond wires 318 or other interconnect are formed between semiconductor die 154 and conductive layer 308, which includes contact pads adjacent to semiconductor die 124 and 154. In one embodiment, semiconductor die 154 includes a length of 1.6 mm and a width of 0.8 mm. In another embodiment, semiconductor die 154 include dimensions or a footprint of 1.6 mm by 1.6 mm. Semiconductor die 124 include dimensions of, for example, 0.8 mm by 1.25 mm. A final package footprint may be 3.3 mm by 2.5 mm or less.

A protective cover or lid 320 is mounted over semiconductor die 154, semiconductor die 124, and substrate 300. In one embodiment, lid 320 includes a metal having a low thermal conductivity or another material having low thermal conductivity. In another embodiment, lid 320 includes a sacrificial base material such as silicon, polymer, beryllium oxide, glass, or other suitable low-cost, rigid material. Alternatively, lid 320 operates as a heat spreader and includes Cu, Al, or other material with high thermal conductivity. In yet another embodiment, lid 320 operates as a shielding layer and includes Al, ferrite or carbonyl iron, stainless steel, nickel silver, low-carbon steel, silicon-iron steel, foil, conductive resin, or other metals and composites capable of blocking or absorbing EMI, RF interference, harmonic distortion, and other inter-device interference.

Lid 320 is disposed over the individual semiconductor packages on substrate 300. Lid 320 is mounted substrate 300 using a suitable attachment or bonding process. In one embodiment, lid 320 is attached to substrate 300 using an adhesive material, such as epoxy resin or thermal epoxy. The adhesive material is cured to secure lid 320 to surface 302 of substrate 300. In another embodiment, lid 320 is attached to conductive layer 308 of substrate 300 using a bump material, such as Al, Sn, Ni, Au, Ag, Pb, Bi, Cu, solder, or combinations thereof. The bump material is reflowed by heating the material above its melting point to form balls or bumps. Lid 320 operates to protect active region 162 and active surface 160 of semiconductor die 154 as well as semiconductor die 124.

Lid 320 includes an optional opening 322 formed through lid 320. The shape and position of the opening 322 may be selected for acoustic effect or other design considerations. In one embodiment, opening 322 is disposed directly over active region 162. Opening 322 operates as an acoustic port by permitting sound waves to enter through opening 322.

Lid 320 forms a chamber or relief area 324 over semiconductor die 154 and 124. Chamber 324 formed by lid 320 further operates as an acoustic chamber for a MEMS microphone. In a MEMS microphone embodiment, chamber 324 may operate as a front chamber, and cavity 166 in semiconductor die 154 may operate as a back chamber. The shape and size of chamber 324 is selected for improved acoustic performance, such as to prevent resonance. Active region 162 may include a diaphragm sensitive to changes in air pressure, for example, caused by sound waves. Sound waves enter through opening 322 in lid 320, and active region 162 responds to the changes in air pressure caused by the sound waves.

Substrate 300 is singulated with saw blade or laser cutting device 326 into individual semiconductor devices or packages 330. In another embodiment, substrate 300 is singulated prior to mounting semiconductor die 154 and 124.

Figure 12:
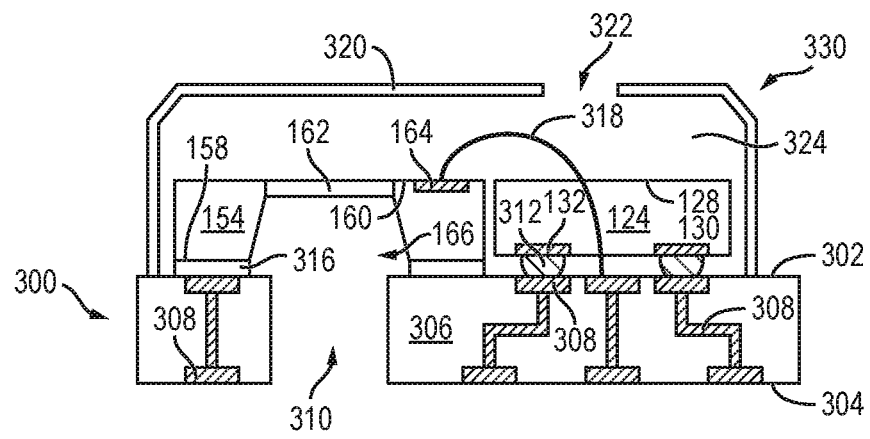
FIGS. 12-14 illustrate MEMS packages including a MEMS semiconductor die and flipchip semiconductor die mounted over a substrate.

FIG. 12 shows a semiconductor package 330 after singulation. Semiconductor package 330 includes a wire bonded semiconductor die 154 and a flipchip mounted semiconductor die 124. Semiconductor die 154 is electrically connected to substrate 300 through bond wires 318 and to semiconductor die 124 through substrate 300. Semiconductor package 330 may electrically connect to external devices through substrate 300. Semiconductor die 124 and 154 are disposed side-by-side over substrate 300 to reduce the height of semiconductor package 330. The flipchip mount for semiconductor die 124 also reduces the footprint size of semiconductor package 330. Bumps 312 provide a more compact electrical interconnection of semiconductor die 154 to substrate 300, because bumps 312 are disposed directly below and within a footprint of semiconductor die 154 rather than being adjacent to or lateral to semiconductor die 154. Thus, bumps 312 reduce the footprint of semiconductor package 330 compared to a wire bonded die. In one embodiment, semiconductor die 154 includes dimensions of 1.6 mm by 0.8 mm or 1.6 mm by 1.6 mm, and semiconductor die 124 includes dimensions of 0.8 mm by 1.25 mm. The design semiconductor package 330 results in a reduced package size having footprint dimensions of approximately 3.3 mm by 2.5 mm or less. In one embodiment, semiconductor die 124 includes an ASIC, and semiconductor die 154 includes a MEMS or other active or passive sensors responsive to various external stimuli. In a MEMS microphone embodiment, opening 322 in lid 320 and opening 310 in substrate 300 may operate as acoustic ports by permitting sound waves to move through each opening 322 and 310. Sound waves or other stimuli may enter through either opening 322 in lid 320 or opening 310 in substrate 300. In one embodiment, chamber 324 operates as a front chamber, and cavity 166 in semiconductor die 154 and opening 310 in substrate 300 operate as a back chamber. Alternatively, cavity 166 and opening 310 operate as a front chamber, and chamber 324 operates as a back chamber.

Figure 13:
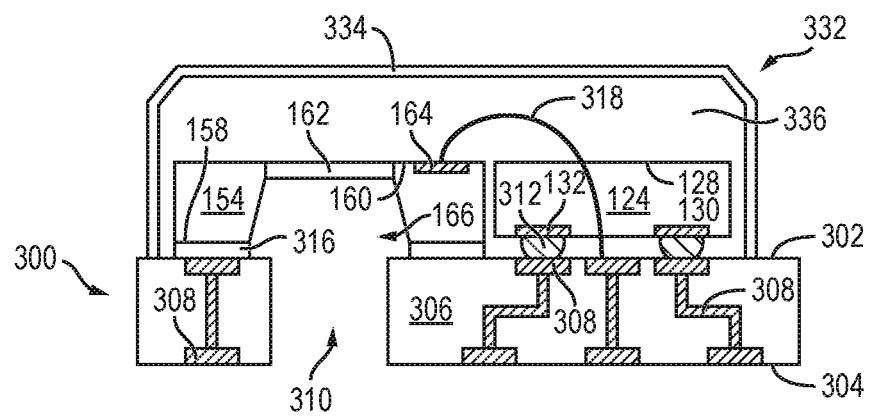

FIG. 13 shows a semiconductor package 332 similar to semiconductor package 330 but without an opening in lid 334. Lid 334 forms a chamber or relief area 336 over semiconductor die 124 and 154. In one embodiment, semiconductor die 124 includes an ASIC, and semiconductor die 154 includes a MEMS or other active or passive sensors responsive to various external stimuli. Chamber 336 formed by lid 334 may operate as an acoustic chamber for a MEMS microphone. In a MEMS microphone embodiment, chamber 336 may operate as a back chamber. Opening 310 in substrate 300 and cavity 166 in semiconductor die 154 operate as a front chamber and permit sound waves to reach active region 162. Active region 162 may include a diaphragm sensitive to changes in air pressure, for example, caused by sound waves. The shape and size of each chamber is selected for improved acoustic performance, such as to prevent resonance.

Semiconductor die 124 and 154 are disposed side-by-side over substrate 300 to reduce the height of semiconductor package 332. The flipchip mount for semiconductor die 124 also reduces the footprint size of semiconductor package 332. Bumps 312 provide a more compact electrical interconnection of semiconductor die 154 to substrate 300, because bumps 312 are disposed directly below and within a footprint of semiconductor die 154 rather than being adjacent to or lateral to semiconductor die 154. Thus, bumps 312 reduce the footprint of semiconductor package 332 compared to a wire bonded die. The design of semiconductor package 332 results in a reduced package size having footprint dimensions of approximately 3.3 mm by 2.5 mm or less.

Figure 14:
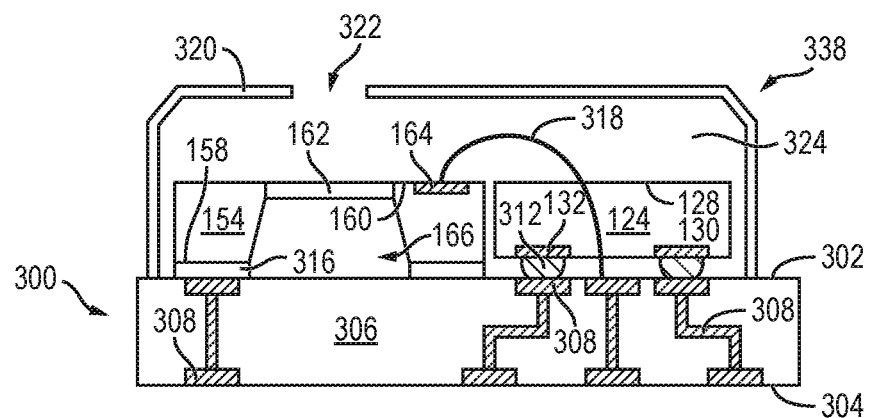

FIG. 14 shows a semiconductor package 338 similar to semiconductor package 330 but without an opening in substrate 300. Lid 320 forms a chamber or relief area 324 over semiconductor die 124 and 154. Lid 320 includes an optional opening 322 formed through lid 320. The shape and position of the opening 322 may be selected for acoustic effect or other design considerations. In one embodiment, opening 322 is disposed directly over active region 162 and operates as an acoustic port by permitting sound waves to enter through opening 322. Chamber 324 formed by lid 320 further operates as an acoustic chamber for a MEMS microphone. In a MEMS microphone embodiment, chamber 324 may operate as a front chamber, and cavity 166 in semiconductor die 154 may operate as a back chamber. The shape and size of chamber 324 is selected for improved acoustic performance, such as to prevent resonance.

Semiconductor die 124 and 154 are disposed side-by-side over substrate 300 to reduce the height of semiconductor package 338. The flipchip mount for semiconductor die 124 also reduces the footprint size of semiconductor package 338. Bumps 312 provide a more compact electrical interconnection of semiconductor die 154 to substrate 300, because bumps 312 are disposed directly below and within a footprint of semiconductor die 154 rather than being adjacent to or lateral to semiconductor die 154. Thus, bumps 312 reduce the footprint of semiconductor package 338 compared to a wire bonded die. The design of semiconductor package 338 results in a reduced package size having footprint dimensions of approximately 3.3 mm by 2.5 mm or less.

Figure 15C:
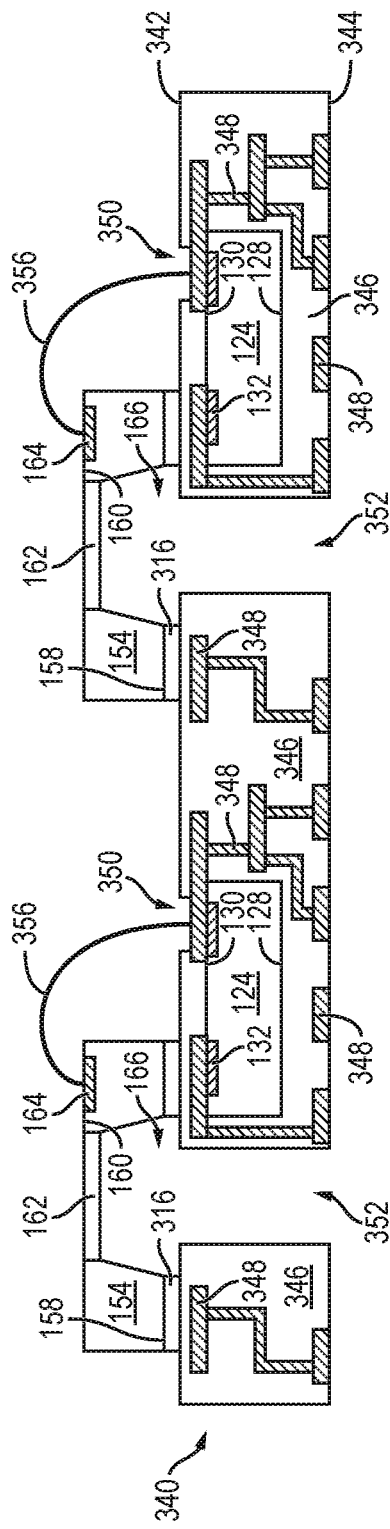

FIGS. 15a-15d illustrate, in relation to FIGS. 1, 2a-2d, and 3a-3c, a method of making a MEMS package including a semiconductor die mounted over a substrate with embedded semiconductor die. FIG. 15a shows a cross-sectional view of a portion of a substrate or interposer panel 340 having opposing surfaces 342 and 344. Substrate 340 includes an insulating material 346 and one or more conductive layers 348. Semiconductor die 124 from FIG. 2d are embedded within substrate 340. Insulating material 346 can include a multilayer structure comprising an organic substrate core, prepreg, and solder mask material with resin, filler, and/or glass fiber. Conductive layers 348 can include multiple layers of metal, e.g., Cu, sandwiched or disposed between the various layers of insulating material 346. The various metal layers 348 are patterned and electrically connected according to the interconnection design and function of the semiconductor die subsequently mounted to substrate 340 and the final semiconductor package. In one embodiment, substrate 340 contains one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Substrate 340 can be laminate based, thin flexible circuit based, ceramic, copper foil, glass, and may include a semiconductor wafer with an active surface containing one or more transistors, diodes, and other circuit elements to implement analog circuits or digital circuits.

Insulating material 346 is formed using PVD, CVD, printing, lamination, spin coating, spray coating, sintering, or thermal oxidation. Insulating material 346 contains one or more layers of $SiO_2$, $Si_3N_4$, SiON, $Ta_2O_5$, $Al_2O_3$, or other material having similar insulating and structural properties. In one embodiment, one of the layers of insulating material 346 is formed using BT resin with glass fiber and silica fillers and another layer of insulating material 346 at surface 342 or 344 of substrate 340 is formed using a solder mask material. A portion of insulating layer 346 is removed by LDA, etching, or other suitable process to form openings 350 to expose portions of conductive layer 348.

Conductive layers 348 of substrate 340 are formed using a patterning and metal deposition process such as sputtering, electrolytic plating, metal foil lamination, chemical etching back, or electroless plating. Conductive layers 348 can be one or more layers of Al, Cu, Sn, Ni, Au, Ag, Ti, TiW, W, or other suitable electrically conductive material. Conductive layers 348 include lateral RDL and vertical conductive vias to provide electrical interconnect through substrate 340. Portions of conductive layers 348 are electrically common or electrically isolated according to the design and function of the semiconductor die to be mounted to substrate 340.

One or more openings 352 formed through substrate 340. Openings 352 extend completely through substrate 340 from surface 342 to surface 344. Openings 352 may be formed in an area of substrate 340 over which a semiconductor die is subsequently mounted. Openings 352 are devoid of any material and allows stimuli, e.g., light or sound, to pass through substrate 340 and reach sensors on the active surface of the subsequently mounted semiconductor die.

In FIG. 15b, semiconductor die 154 from FIG. 3b are disposed over and mounted to substrate 340 using, for example, a pick and place operation. Semiconductor die 154 are positioned with cavity 166 disposed over opening 352 in substrate 340. In one embodiment, semiconductor die 154 are disposed with back surface 158 of semiconductor die 154 oriented toward substrate 340. Semiconductor die 154 are mounted to substrate 340 with a die attach adhesive or film 316, such as epoxy resin. In another embodiment, die attach adhesive 316 includes a TIM such as thermal epoxy, thermal epoxy resin, thermal conductive paste, aluminum oxide, zinc oxide, boron nitride, pulverized silver, or thermal grease. Die attach adhesive 316 is cured to secure semiconductor die 154 to substrate 340. In one embodiment, semiconductor die 154 are mounted to substrate 340 at the wafer-level or panel-level in a chip-on-wafer assembly. In another embodiment, substrate 340 is singulated prior to mounting semiconductor die 154. Semiconductor die 154 is a KGD having been tested prior to mounting to substrate 340.

In FIG. 15c, a plurality of bond wires 356 is formed between substrate 340 and semiconductor die 154. Bond wires 356 are mechanically and electrically coupled to conductive layer 348 of substrate 340 and to contact pads 164 of semiconductor die 154 by thermocompression bonding, ultrasonic bonding, wedge bonding, stitch bonding, ball bonding, or other suitable bonding technique. Bond wires 356 include a conductive material such as Cu, Al, Au, Ag, metal alloy, or a combination thereof. Bond wires 356 electrically couple semiconductor die 154 to conductive layer 348, which is electrically coupled to semiconductor die 124. Bond wires 356 represent one type of interconnect structure that electrically couples semiconductor die 154 to substrate 340. In another embodiment, an electrically conductive layer, such as an RDL, or bumps are used instead of bond wires 356 to electrically couple semiconductor die 154 to substrate 340.

Figure 15D:
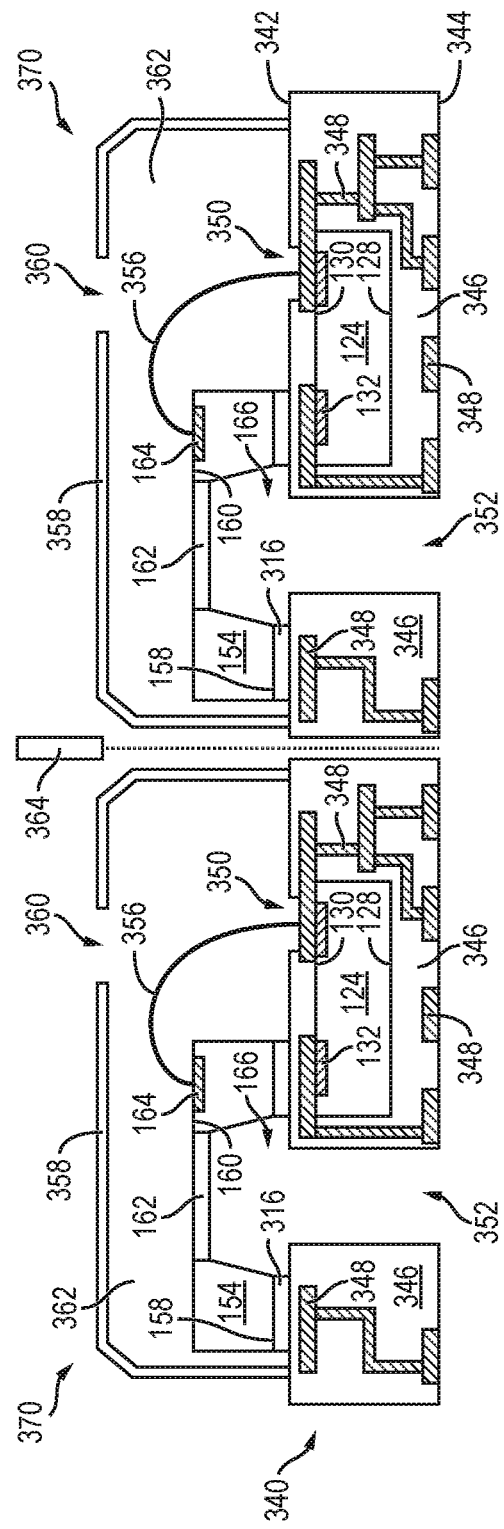

In FIG. 15d, a protective cover or lid 358 is mounted over semiconductor die 154, semiconductor die 124, and substrate 340. In one embodiment, lid 358 includes a metal having a low thermal conductivity or another material having low thermal conductivity. In another embodiment, lid 358 includes a sacrificial base material such as silicon, polymer, beryllium oxide, glass, or other suitable low-cost, rigid material. Alternatively, lid 358 operates as a heat spreader and includes Cu, Al, or other material with high thermal conductivity. In yet another embodiment, lid 358 operates as a shielding layer and includes Al, ferrite or carbonyl iron, stainless steel, nickel silver, low-carbon steel, silicon-iron steel, foil, conductive resin, or other metals and composites capable of blocking or absorbing EMI, RF interference, harmonic distortion, and other inter-device interference.

Lid 358 is disposed over the individual semiconductor packages on substrate 340. Lid 358 is mounted substrate 340 using a suitable attachment or bonding process. In one embodiment, lid 358 is attached to substrate 340 using an adhesive material, such as epoxy resin or thermal epoxy. The adhesive material is cured to secure lid 358 to surface 342 of substrate 340. In another embodiment, lid 358 is attached to conductive layer 348 of substrate 340 using a bump material, such as Al, Sn, Ni, Au, Ag, Pb, Bi, Cu, solder, or combinations thereof. The bump material is reflowed by heating the material above its melting point to form balls or bumps. Lid 358 operates to protect active region 162 and active surface 160 of semiconductor die 154 as well as bond wires 356 and semiconductor die 124.

Lid 358 includes an optional opening 360 formed through lid 358. The shape and position of the opening 360 may be selected for acoustic effect or other design considerations. In one embodiment, opening 360 is disposed directly over active region 162. Opening 360 operates as an acoustic port by permitting sound waves to enter through opening 360.

Lid 358 forms a chamber or relief area 362 over semiconductor die 154 and 124. Chamber 362 formed by lid 358 further operates as an acoustic chamber for a MEMS microphone. In a MEMS microphone embodiment, chamber 362 may operate as a front chamber, and cavity 166 in semiconductor die 154 may operate as a back chamber. The shape and size of chamber 362 is selected for improved acoustic performance, such as to prevent resonance. Active region 162 may include a diaphragm sensitive to changes in air pressure, for example, caused by sound waves. Sound waves enter through opening 360 in lid 358, and active region 162 responds to the changes in air pressure caused by the sound waves.

Substrate 340 is singulated with saw blade or laser cutting device 364 into individual semiconductor devices or packages 370. In another embodiment, substrate 340 is singulated prior to mounting semiconductor die 154.

Figure 16:
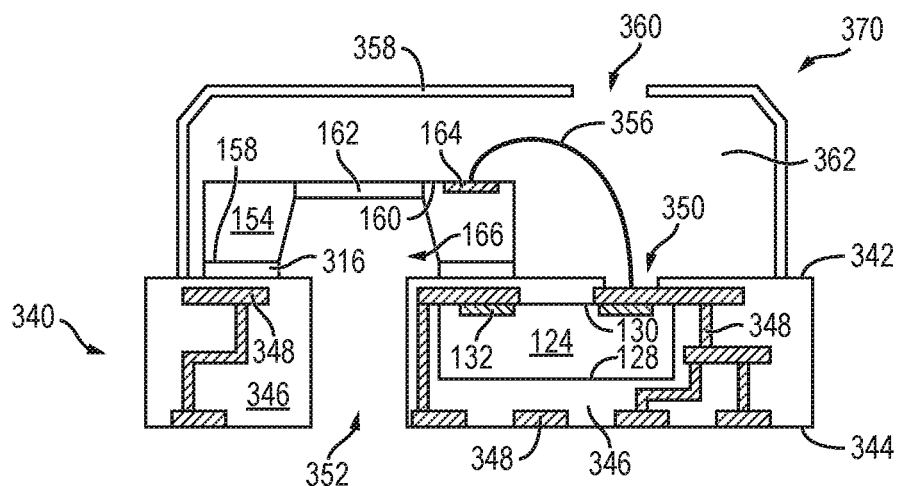

FIG. 16 shows a semiconductor package 370 after singulation. Semiconductor package 370 includes a wire bonded semiconductor die 154 and an embedded semiconductor die 124. Semiconductor die 154 is electrically connected to substrate 340 through bond wires 356 and to semiconductor die 124 through conductive layers 348 of substrate 340. Semiconductor package 370 may electrically connect to external devices through substrate 340. Semiconductor die 124 is embedded within substrate 340 to reduce the height of semiconductor package 370. Additionally, semiconductor die 154 is stacked over semiconductor die 124 within substrate 340, thereby decreasing the overall size and footprint of semiconductor package 370. The stacked and embedded design of semiconductor package 370 optimizes the reduction of both package height and package footprint to reduce the total size of the semiconductor package.

In one embodiment, semiconductor die 154 includes dimensions of 1.6 mm by 0.8 mm or 1.6 mm by 1.6 mm, and semiconductor die 124 includes dimensions of 0.8 mm by 1.25 mm. The design semiconductor package 370 results in a reduced package size having footprint dimensions of approximately 3.3 mm by 2.5 mm or less. In one embodiment, semiconductor die 124 includes an ASIC, and semiconductor die 154 includes a MEMS or other active or passive sensors responsive to various external stimuli. In a MEMS microphone embodiment, opening 360 in lid 358 and opening 352 in substrate 340 may operate as acoustic ports by permitting sound waves to move through each opening 360 and 352. Sound waves or other stimuli may enter through either opening 360 in lid 358 or opening 352 in substrate 340. In one embodiment, chamber 362 operates as a front chamber, and cavity 166 in semiconductor die 154 and opening 352 in substrate 340 operate as a back chamber. Alternatively, cavity 166 and opening 352 operate as a front chamber, and chamber 362 operates as a back chamber.

Figure 17:
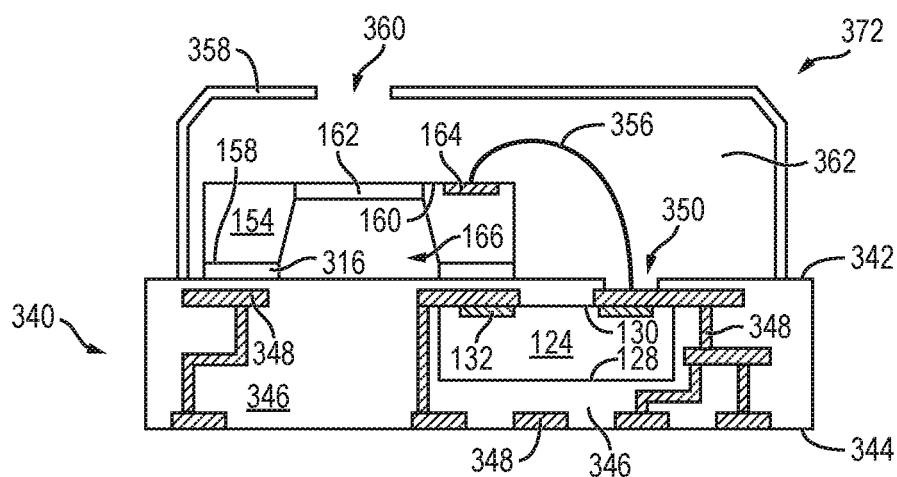

FIG. 17 shows a semiconductor package 372 similar to semiconductor package 370 but without an opening in substrate 340. Lid 358 forms a chamber or relief area 362 over semiconductor die 154 and substrate 340. Lid 358 includes an optional opening 360 formed through lid 358. The shape and position of the opening 360 may be selected for acoustic effect or other design considerations. In one embodiment, opening 360 is disposed directly over active region 162 and operates as an acoustic port by permitting sound waves to enter through opening 360. Chamber 362 formed by lid 358 further operates as an acoustic chamber for a MEMS microphone. In a MEMS microphone embodiment, chamber 362 may operate as a front chamber, and cavity 166 in semiconductor die 154 may operate as a back chamber. The shape and size of chamber 362 is selected for improved acoustic performance, such as to prevent resonance.

Semiconductor die 124 is embedded within substrate 340 to reduce the height of semiconductor package 372. Additionally, semiconductor die 154 is stacked over semiconductor die 124 within substrate 340, thereby decreasing the overall size and footprint of semiconductor package 372. The stacked and embedded design of semiconductor package 372 optimizes the reduction of both package height and package footprint to reduce the total size of the semiconductor package. The design of semiconductor package 372 results in a reduced package size having footprint dimensions of approximately 3.3 mm by 2.5 mm or less.

Figure 18:
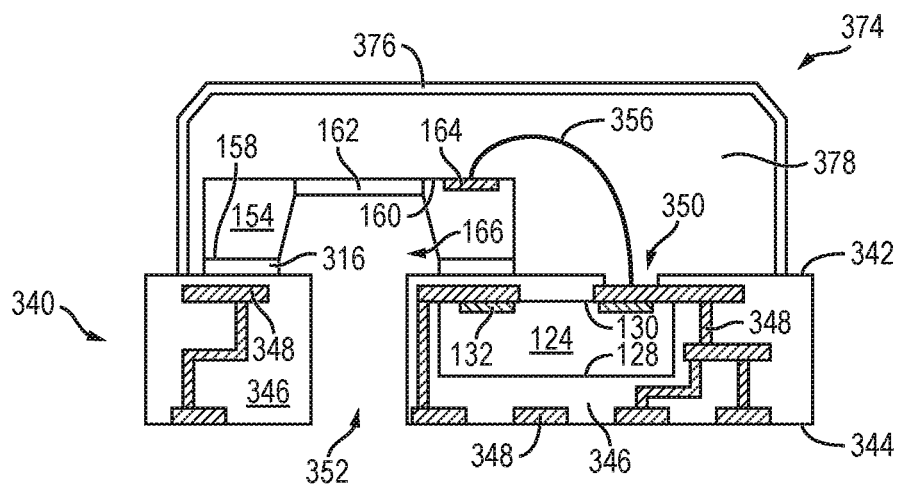

FIG. 18 shows a semiconductor package 374 similar to semiconductor package 370 but without an opening in lid 376. Lid 376 forms a chamber or relief area 378 over semiconductor die 154 and substrate 340. In one embodiment, semiconductor die 124 includes an ASIC, and semiconductor die 154 includes a MEMS or other active or passive sensors responsive to various external stimuli. Chamber 378 formed by lid 376 may operate as an acoustic chamber for a MEMS microphone. In a MEMS microphone embodiment, chamber 378 may operate as a back chamber. Opening 352 in substrate 340 and cavity 166 in semiconductor die 154 operate as a front chamber and permit sound waves to reach active region 162. Active region 162 may include a diaphragm sensitive to changes in air pressure, for example, caused by sound waves. The shape and size of each chamber is selected for improved acoustic performance, such as to prevent resonance.

Semiconductor die 124 is embedded within substrate 340 to reduce the height of semiconductor package 374. Additionally, semiconductor die 154 is stacked over semiconductor die 124 within substrate 340, thereby decreasing the overall size and footprint of semiconductor package 374. The stacked and embedded design of semiconductor package 374 optimizes the reduction of both package height and package footprint to reduce the total size of the semiconductor package. The design of semiconductor package 374 results in a reduced package size having footprint dimensions of approximately 3.3 mm by 2.5 mm or less.

FIG. 19 shows a semiconductor package 380 similar to semiconductor package 370 but with an alternative orientation of semiconductor die 124. The position of semiconductor die 124 embedded within substrate 340 is selected based on the function of the final semiconductor device. Semiconductor die 124 includes active surface 130 oriented away from semiconductor die 154. Semiconductor die 154 is electrically connected to semiconductor die 124 through conductive layer 164, bond wires 356, substrate 340 including conductive layers 348, and conductive layer 132 of semiconductor die 124.

Figure 20B:
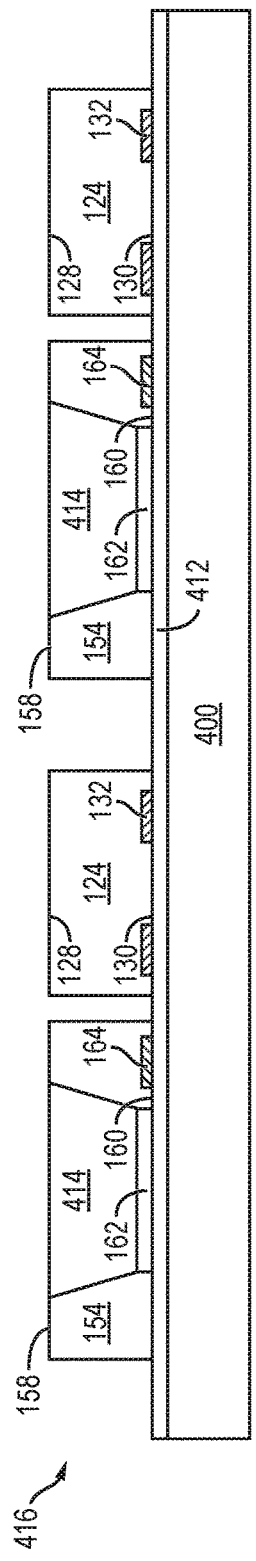

FIGS. 20a-20l illustrate a method of making an eWLB package including a MEMS semiconductor die disposed adjacent to a semiconductor die. FIG. 20a shows a cross-sectional view of a portion of a carrier or temporary substrate 400 containing sacrificial base material such as silicon, polymer, beryllium oxide, glass, or other suitable low-cost, rigid material for structural support. An interface layer or double-sided tape 412 is formed over carrier 400 as a temporary adhesive bonding film, etch-stop layer, or thermal release layer.

Carrier 400 can be a round or rectangular panel (greater than 300 mm) with capacity for multiple semiconductor die 124 and 154. Carrier 400 may have a larger surface area than the surface area of semiconductor wafer 120 or 150. The number of semiconductor die 124 and 154 mounted to carrier 400 can be greater than the number of semiconductor die 124 singulated from semiconductor wafer 120 or 150. The larger surface area of carrier 400 accommodates more semiconductor die 124 and 154 and lowers manufacturing cost as more semiconductor die can be processed on the larger carrier thereby reducing the cost per unit. Semiconductor packaging and processing equipment is designed and configured for the size of the wafer or carrier being processed.

To further reduce manufacturing costs, the size of carrier 400 is selected independent of the size of semiconductor die 124 and 154 or the size of semiconductor wafer 120 and 150. That is, carrier 400 has a fixed or standardized size, which can accommodate various size semiconductor die 124 and 154 singulated from one or more semiconductor wafers 120 and 150. In one embodiment, carrier 400 is circular with a diameter of 330 mm. In another embodiment, carrier 400 is rectangular with a width of 560 mm and length of 600 mm. Semiconductor die 124 may have dimensions of 0.8 mm by 1.25 mm, which are placed on the standardized carrier 400. Semiconductor die 154 may have dimensions of 0.8 mm by 1.6 mm, which are placed on the standardized carrier 400. Alternatively, semiconductor die 154 may have dimensions of 1.6 mm by 1.6 mm, which are placed on the same standardized carrier 400. Accordingly, standardized carrier 400 can handle any size or quantity of semiconductor die 124 and 154, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 400 lowers manufacturing costs and capital risk by reducing or eliminating the need for specialized semiconductor processing lines based on die size or incoming wafer size. By selecting a predetermined carrier size to use for any size semiconductor die from all semiconductor wafer sizes, a flexible manufacturing line can be implemented.

Semiconductor die 124 from FIG. 2d are disposed over interface layer 412 and over carrier 400 using, for example, a pick and place operation with active surface 130 oriented toward the carrier. Semiconductor die 154 from FIG. 3b are disposed over interface layer 412 and over carrier 400 using, for example, a pick and place operation with active surface 160 oriented toward the carrier. When semiconductor die 124 adjacent to semiconductor die 154, a gap or space may remain between semiconductor die 124 and semiconductor die 154.

Semiconductor die 154 includes an optional temporary protection or sacrificial layer 414 formed over one or more surfaces of semiconductor die 154. Sacrificial layer 414 may include one or more layers of SiO2, Si3N4, SiON, Ta2O5, Al2O3, photoresist, liquid coating material, dry film, polymer film, polymer composite, or other material and is easily removed. Sacrificial layer 414 may include polysilicon, silicon, or other bulk semiconductor material or suitable material. Sacrificial layer 414 may be formed over back surface 158 of semiconductor die 154 to fill cavity 166 and to planarize back surface 158 of semiconductor die 154. In another embodiment, an optional cover or cap, not shown, may be disposed over active surface 160 of semiconductor die 154 to protect active region 162.

FIG. 20b shows semiconductor die 124 and 154 mounted to interface layer 412 of carrier 400 as reconstituted panel or reconfigured wafer 416. Reconstituted wafer or panel 416 can be processed into many types of semiconductor packages, including eWLB, fan-in WLCSP, eWLCSP, fan-out WLCSP, flipchip packages, 3D packages, PoP, or other semiconductor packages. Reconstituted panel 416 is configured according to the specifications of the resulting semiconductor package.

Figure 20C:
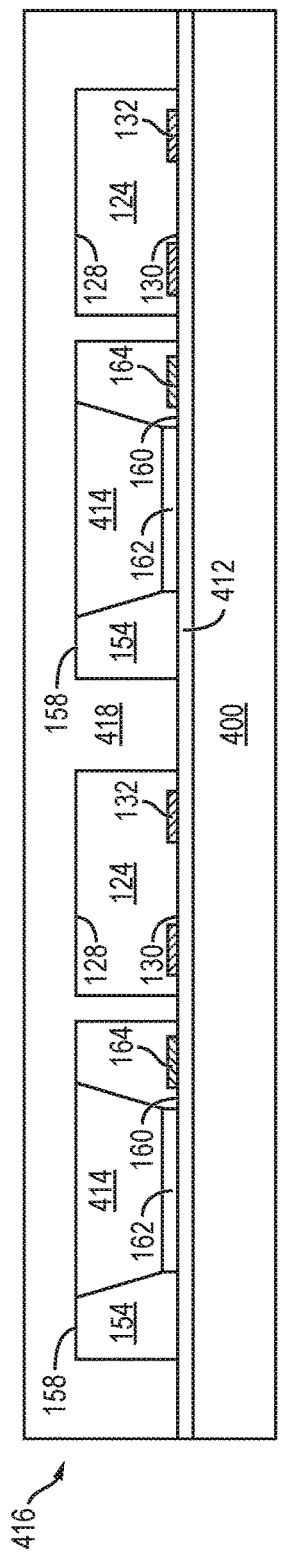
Figure 20D:
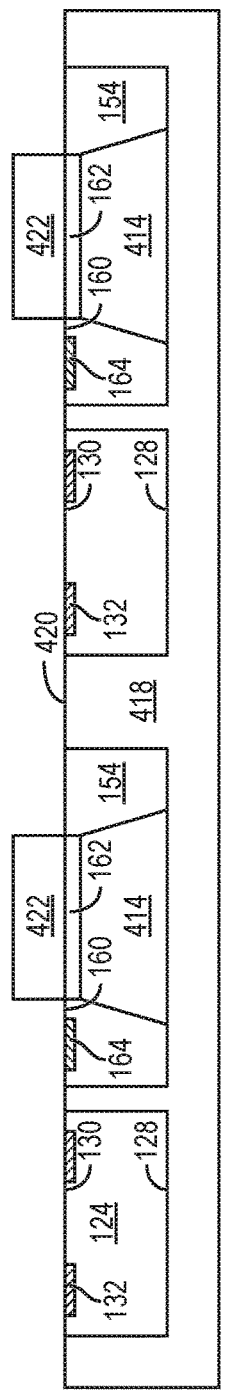

In FIG. 20c, an encapsulant or molding compound 418 is deposited over semiconductor die 124 and 154 and over carrier 400 as an insulating material using a paste printing, compressive molding, transfer molding, liquid encapsulant molding, vacuum lamination, spin coating, or other suitable applicator. In particular, encapsulant 418 covers the side surfaces and back surfaces of semiconductor die 124 and 154. Encapsulant 418 includes polymer composite material, such as epoxy resin with filler, epoxy acrylate with filler, or polymer with proper filler. Encapsulant 418 is non-conductive and environmentally protects the semiconductor device from external elements and contaminants. Encapsulant 418 is deposited between and around semiconductor die 124 and 154 to cover the side surfaces of semiconductor die 124 and 154. FIG. 20d shows reconstituted panel 416 inverted with respect to the view in FIG. 20c.

In FIG. 20d, temporary carrier 400 and optional interface layer 412 are removed by chemical etching, mechanical peel-off, CMP, mechanical grinding, thermal bake, laser scanning, or wet stripping. Surface 420 of encapsulant 418, active surface 130 of semiconductor die 124, active surface 160 of semiconductor die 154 are exposed after carrier 400 and interface layer 412 are removed. In one embodiment, surface 420 of encapsulant 418 is coplanar with active surface 130 of semiconductor die 124 and active surface 160 of semiconductor die 154.

An optional temporary protection or sacrificial layer 422 is formed over active region 162 of semiconductor die 154. Sacrificial layer 422 may include one or more layers of SiO2, Si3N4, SiON, Ta2O5, Al2O3, photoresist, liquid coating material, dry film, polymer film, polymer composite, or other material and is easily removed. Sacrificial layer 422 may include polysilicon, silicon, or other bulk semiconductor material or suitable material. In another embodiment, an optional cover or cap, not shown, may be disposed over active surface 160 of semiconductor die 154 to protect active region 162.

In FIG. 20e, an insulating or passivation layer 424 is formed over active surface 130 of semiconductor die 124, over active surface 160 of semiconductor die 154, and over surface 420 of encapsulant 418 using PVD, CVD, printing, spin coating, spray coating, sintering or thermal oxidation. Insulating layer 424 includes one or more layers of SiO2, Si3N4, SiON, Ta2O5, Al2O3, low temperature curable polymer dielectric resist (i.e., cures at less than 250° C.), BCB, PBO, epoxy based photosensitive polymer dielectric, or other material having similar insulating and structural properties. A portion of insulating layer 424 is removed by LDA, etching, or other suitable process to expose conductive layers 132 and 164.

An electrically conductive layer 426 is formed over insulating layer 424 and contact pads 132 and 164 using a patterning and metal deposition process such as PVD, CVD, sputtering, electrolytic plating, and electroless plating. Conductive layer 426 includes one or more layers of Al, Cu, Ti, TiW, Sn, Ni, Au, Ag, W, or other suitable electrically conductive material or combination thereof. Conductive layer 426 operates as an RDL to redistribute electrical connection from semiconductor die 124 to outside a footprint of semiconductor die 124 and from semiconductor die 154 to outside a footprint of semiconductor die 154. One portion of conductive layer 426 is electrically connected to contact pads 132 of semiconductor die 124 or contact pads 164 of semiconductor die 154. Other portions of conductive layer 426 are electrically common or electrically isolated depending on the design and function of the semiconductor device. Conductive layer 426 electrically connects contact pads 132 of semiconductor die 124 to contact pads 164 of semiconductor die 154.

An insulating or passivation layer 428 is formed over insulating layer 424 and conductive layer 426 using PVD, CVD, printing, spin coating, spray coating, sintering or thermal oxidation. Insulating layer 428 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. A portion of insulating layer 428 is removed by LDA, etching, or other suitable process to form openings 430 to expose portions of conductive layer 426.

In FIG. 20f, an electrically conductive layer 432 is formed within openings 430 in insulating layer 424 and over conductive layer 426 using a patterning and metal deposition process such as PVD, CVD, sputtering, electrolytic plating, and electroless plating. Conductive layer 432 includes one or more layers of Al, Cu, Ti, TiW, Sn, Ni, Au, Ag, W, or other suitable electrically conductive material or combination thereof. Conductive layer 432 operates as an RDL or under bump metallization (UBM). Conductive layer 432 includes a multi-metal stack with an adhesion layer, a barrier layer, and a seed or wetting layer. One portion of conductive layer 432 is electrically connected to conductive layer 426. Other portions of conductive layer 432 are electrically common or electrically isolated depending on the design and function of the semiconductor device.

Insulating layers 424 and 428 together with conductive layers 426 and 432 form a build-up interconnect structure 434 formed over reconstituted panel 416 including over semiconductor die 124, semiconductor die 154, and encapsulant 418. The number of insulating and conductive layers included within interconnect structure 434 depends on, and varies with, the complexity of the circuit routing design. Accordingly, interconnect structure 434 can include any number of insulating and conductive layers to facilitate electrical interconnect with respect to semiconductor die 124 and 154. Reconstituted panel 416 is optionally singulated after forming interconnect structure 434. FIG. 20g shows reconstituted panel 416 inverted with respect to the view in FIG. 20f.

In FIG. 20g, a back surface 435 of encapsulant 418 undergoes an optional backgrinding operation with grinder 436 or other suitable mechanical or etching process to remove a portion of encapsulant 418 from over semiconductor die 124 and 154 to reduce a thickness of reconstituted panel 416. A chemical etch, polishing, or CMP process can also be used to planarize encapsulant 418 and to remove mechanical damage resulting from the grinding operation.

An optional backgrinding tape or support tape 438 is applied over reconstituted panel 416 and in contact with interconnect structure 434. In another embodiment, support tape 438 includes a thermally resistant tape, warpage balancing tape, thermal release layer, temporary adhesive bonding film, or other tape. For example, support tape 438 may include a material having high thermal conductivity and high heat resistance. Alternatively, reconstituted panel 416 is placed in a supporting jig with or without support tape 438.

The backgrinding operation removes a portion of encapsulant 418 to expose semiconductor die 124 and semiconductor die 154. In one embodiment, the backgrinding operation removes a portion of semiconductor die 124 from back surface 128 leaving new back surface 440 of semiconductor die 124. In an alternative embodiment, encapsulant 418 remains covering back surface 128 of semiconductor die 124. The backgrinding operation removes a portion of sacrificial layer 414 and a portion of semiconductor die 154 from back surface 158 leaving new back surface 442 of semiconductor die 154.

FIG. 20h shows reconstituted panel 416 after backgrinding. After backgrinding, surface 444 of encapsulant 418 is coplanar with new back surface 442 of semiconductor die 154 and new back surface 440 of semiconductor die 124.

In FIG. 20i, sacrificial layer 414 is removed from over semiconductor die 154 to form cavity 450 in semiconductor die 154. Sacrificial layer 414 is removed etching, peeling, deionized (DI) water spray and rinse, solvent or chemical stripping, or other suitable process. Cavity 450 may extend completely through semiconductor die 154, from new back surface 442 to active surface 160. Cavity 450 extends to active region 162. Cavity 450 operates to permit external stimuli, such as sound waves, to reach active region 162. For example, in a MEMS microphone, cavity 450 permits air flow to active region 162, and active region 162 responds to changes in air pressure caused by sound waves.

In FIG. 20j, support tape 438 is removed from over reconstituted panel 416 by chemical etching, mechanical peel-off, CMP, mechanical grinding, thermal bake, laser scanning, or wet stripping. Sacrificial layer 422 is removed from over active region 162 of semiconductor die 154. Sacrificial layer 422 is removed by etching, peeling, DI water spray and rinse, solvent or chemical stripping, or other suitable process. The removal of sacrificial layer 422 leaves cavity or non-routing area 452. Cavity 452 is devoid of insulating layers 424 and 428 and conductive layers 426 and 432.

In FIG. 20k, a protective cover or lid 454 is mounted over semiconductor die 154, semiconductor die 124, and encapsulant 418. Lid 454 is disposed over the individual semiconductor packages within reconstituted panel 416. Lid 454 is mounted to semiconductor die 124 and 154 and encapsulant 418 using a suitable attachment or bonding process. In one embodiment, lid 454 is attached to semiconductor die 124 and 154 and encapsulant 418 using an adhesive material 456, such as epoxy resin or thermal epoxy. Adhesive material 456 is cured to secure lid 454 to semiconductor die 124 and 154 and encapsulant 418. In another embodiment, lid 454 is attached using a bump material, such as Al, Sn, Ni, Au, Ag, Pb, Bi, Cu, solder, or combinations thereof. The bump material is reflowed by heating the material above its melting point to form balls or bumps. Lid 454 operates to protect active region 162 of semiconductor die 154. Lid 454 leaves a cavity 450 over semiconductor die 154.

Lid 454 includes an optional opening 458 formed through lid 454. The shape and position of the opening 458 may be selected for acoustic effect or other design considerations. In one embodiment, opening 458 is disposed directly over active region 162 and operates as an acoustic port by permitting sound waves to enter through opening 458. Cavity 450 formed by lid 454 further operates as an acoustic chamber for a MEMS microphone. In a MEMS microphone embodiment, cavity 450 may operate as a front chamber, and cavity 452 may operate as a back chamber. The shape and size of cavities 450 and 452 are selected for improved acoustic performance, such as to prevent resonance. Active region 162 may include a diaphragm sensitive to changes in air pressure, for example, caused by sound waves. Sound waves enter through opening 458 in lid 454 or through cavity 452, and active region 162 responds to the changes in air pressure caused by the sound waves.

In FIG. 20l, reconstituted panel 416 is singulated with saw blade or laser cutting device 459 through encapsulant 418 and interconnect structure 434 into individual semiconductor devices or eWLB packages 460. In another embodiment, reconstituted panel 416 is singulated prior to mounting lid 454 over semiconductor die 124 and 154.

Figure 21:
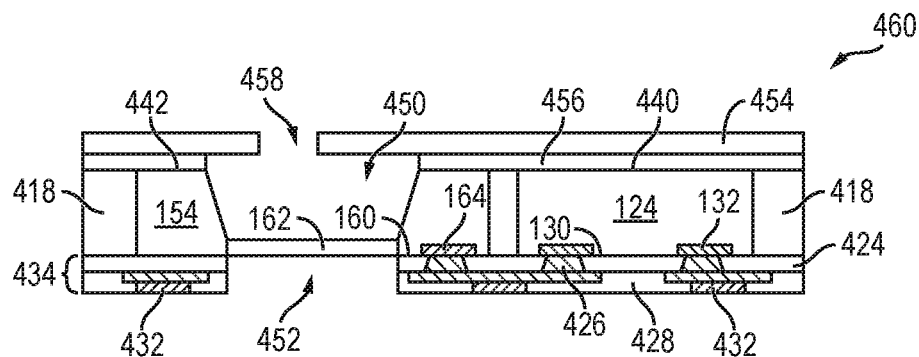
FIGS. 21-23 illustrate MEMS eWLB packages having a MEMS semiconductor die disposed adjacent to a semiconductor die and embedded in an encapsulant.

FIG. 21 shows an eWLB package 460 after singulation. eWLB package 460 includes semiconductor die 124 and 154 embedded in encapsulant 418. Interconnect structure 434 is formed over semiconductor die 124 and 154 and encapsulant 418 to extend electrical interconnection of semiconductor die 124 and 154 to outside a footprint of each die. Interconnect structure 434 includes insulating layers 424 and 428, conductive layers 426 and 432, and may include fewer or additional conductive and insulating layers. Interconnect structure 434 is formed with a non-routing area 452. Semiconductor die 154 is electrically connected to semiconductor die 124 through interconnect structure 434. eWLB package 460 may electrically connect to external devices through interconnect structure 434.

Semiconductor die 124 and 154 are disposed side-by-side within eWLB package 460 to reduce the height of the package compared to stacked devices or devices having substrates. In one embodiment, semiconductor die 154 includes dimensions of 1.6 mm by 0.8 mm or 1.6 mm by 1.6 mm, and semiconductor die 124 includes dimensions of 0.8 mm by 1.25 mm. The design semiconductor package 460 results in a reduced package size having footprint dimensions of approximately 3.3 mm by 2.5 mm or less. In one embodiment, semiconductor die 124 includes an ASIC, and semiconductor die 154 includes a MEMS or other active or passive sensors responsive to various external stimuli. In a MEMS microphone embodiment, opening 458 in lid 454 and non-routing area 452 of interconnect structure 434 may operate as acoustic ports by permitting sound waves to reach active region 162. Sound waves or other stimuli may enter through either opening 458 in lid 454 or area 452 over active region 162. In one embodiment, cavity 450 operates as a front chamber, and area 452 of interconnect structure 434 forms a back chamber. Alternatively, area 452 of interconnect structure 434 operates as a front chamber, and cavity 450 operates as a back chamber.

Figure 22:
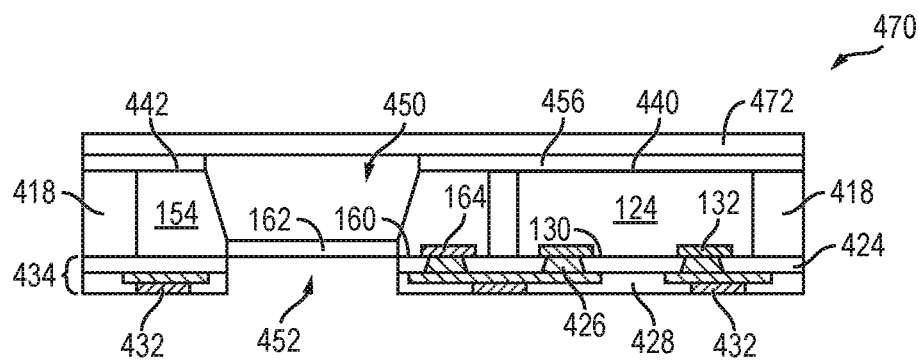

FIG. 22 shows a semiconductor package 470 similar to eWLB package 460 but without an opening in lid 472. Lid 472 leaves cavity 450 over semiconductor die 154. In one embodiment, semiconductor die 124 includes an ASIC, and semiconductor die 154 includes a MEMS or other active or passive sensors responsive to various external stimuli. Cavity 450 may operate as an acoustic chamber for a MEMS microphone. In a MEMS microphone embodiment, cavity 450 may operate as a back chamber. Non-routing area 452 of interconnect structure 434 permits sound waves or other external stimuli to reach active region 162. Active region 162 may include a diaphragm sensitive to changes in air pressure, for example, caused by sound waves. Semiconductor die 124 and 154 are disposed side-by-side within eWLB package 470 to reduce the height of the package compared to stacked devices or devices having substrates. The design of eWLB package 470 results in a reduced package size having footprint dimensions of approximately 3.3 mm by 2.5 mm or less. Additionally, eWLB package 470 is processed as a reconstituted panel 416 on standardized carrier 400. Therefore, eWLB package 470 is manufactured using standardized processing tools, equipment, and bill of materials, thereby further reducing the cost to manufacture eWLB package 470.

Figure 23:
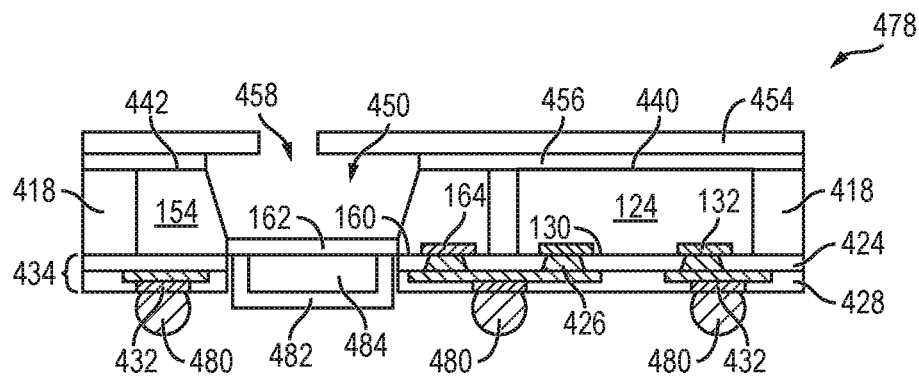

FIG. 23 shows a semiconductor package 478 similar to eWLB package 460 with a protective cap over active region 162 and with bumps 480 formed over interconnect structure 434. An electrically conductive bump material is deposited over interconnect structure 434 and electrically connected to conductive layer 432 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 432 using a suitable attachment or bonding process. In one embodiment, the bump material is reflowed by heating the material above its melting point to form shallow bumps 480. In some applications, bumps 480 are reflowed a second time to improve electrical contact to conductive layer 432. The bumps can also be compression bonded to conductive layer 432. Bumps 480 represent one type of interconnect structure that is formed over conductive layer 432. The interconnect structure can also use bond wires, stud bump, micro bump, or other electrical interconnect. Bumps 480 or other interconnect structures are optional, and in one embodiment, are not formed over interconnect structure 434. For example, interconnect structure 434 without bumps 480 operates as an LGA. In another embodiment, bumps 480 are formed prior to forming cavity 450 in semiconductor die 154.

A cover or cap 482 is disposed over active region 162 of semiconductor die 154. Cap 482 contains glass, silicon, or other suitable base material. Cap 482 completely covers active region 162 and is attached to active surface 160 with a sealing material to form a cavity 484 over active region 162 of semiconductor die 154. Cavity 484 operates as a sealed area directly over active region 162 to protect active region 162.

Semiconductor die 124 and 154 are disposed side-by-side within eWLB package 478 to reduce the height of the package compared to stacked devices or devices having substrates. The design of eWLB package 478 results in a reduced package size having footprint dimensions of approximately 3.3 mm by 2.5 mm or less. Additionally, eWLB package 478 is processed as a reconstituted panel 416 on standardized carrier 400. Therefore, eWLB package 478 is manufactured using standardized processing tools, equipment, and bill of materials, thereby further reducing the cost to manufacture eWLB package 478.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate including,
        an insulating material comprising a bismaleimide triazine (BT) resin,
        a first conductive layer formed over a first surface of the substrate,
        a second conductive layer formed over a second surface of the substrate opposite the first surface,
        a conductive via formed through the insulating material from the first conductive layer to the second conductive layer,
        a first solder mask layer formed over the first surface of the substrate, and
        a second solder mask layer formed over the second surface of the substrate;
    forming a first acoustic port through the insulating material of the substrate;
    disposing a first semiconductor die over the substrate and aligned with the first acoustic port;
    forming a first bond wire coupled between the first semiconductor die and the first conductive layer of the substrate;
    disposing a second semiconductor die over the substrate outside of a footprint of the first semiconductor die, wherein a conductive bump on an active surface of the second semiconductor die is bonded to the first conductive layer; and
    disposing a lid over the first semiconductor die and second semiconductor die, wherein the lid includes a second acoustic port formed through the lid over the second semiconductor die.

2. The method of claim 1, wherein the first semiconductor die includes a microelectromechanical system (MEMS) responsive to sound entering the semiconductor device through the first acoustic port and second acoustic port.

3. The method of claim 1, further including:
    disposing a thermally conductive paste on the first semiconductor die; and
    disposing the first semiconductor die over the substrate with the thermally conductive paste in contact with the substrate.

4. The method of claim 1, further including forming a second bond wire coupled between the first semiconductor die and the first conductive layer of the substrate, wherein the second semiconductor die is disposed between the first bond wire and second bond wire.

5. The method of claim 1, wherein the lid includes a material with a high thermal conductivity to operate as a heat spreader.

6. The method of claim 1, wherein the lid includes a metal or composite material capable of blocking or absorbing electromagnetic interference (EMI) to operate as a shielding layer.

7. A method of making a semiconductor device, comprising:
    providing a substrate including,
        an insulating material,
        a first conductive layer formed over a first surface of the substrate,
        a second conductive layer formed over a second surface of the substrate opposite the first surface, and
        a conductive via formed through the insulating material from the first conductive layer to the second conductive layer;
    forming a first opening through the insulating material of the substrate, wherein the first opening is outside a footprint of the first conductive layer, outside a footprint of the second conductive layer, and outside a footprint of the conductive via;
    providing a first semiconductor die comprising a microelectromechanical system;
    disposing a thermally conductive paste on the first semiconductor die;
    disposing the first semiconductor die over the substrate with the thermally conductive paste in contact with the substrate and with the first semiconductor die aligned with the first opening;
    forming a bond wire between the first semiconductor die and substrate;
    disposing a second semiconductor die over the substrate adjacent to the first semiconductor die, wherein the second semiconductor die is flip chip mounted to the substrate; and
    disposing a lid over the first semiconductor die and second semiconductor die, wherein a width of the lid is less than a width of the substrate.

8. The method of claim 7, further including forming a second opening in the lid over the second semiconductor die.

9. The method of claim 7, wherein the first semiconductor die includes a cavity aligned with the first opening.

10. The method of claim 7, wherein the first semiconductor die includes a microelectromechanical system (MEMS).

11. The method of claim 7, wherein the first semiconductor die includes a microphone.

12. The method of claim 7, further including disposing the second semiconductor die outside a footprint of the first semiconductor die.

13. The method of claim 7, wherein the insulating material of the substrate includes a bismaleimide triazine (BT) resin.

14. The method of claim 13, wherein the substrate further includes:
    a first solder mask layer formed over the first surface of the substrate; and
    a second solder mask layer formed over the second surface of the substrate.

15. A method of making a semiconductor device, comprising:
    providing a substrate comprising an insulating material and a conductive via formed through the insulating material;
    forming a first solder mask over a first surface of the substrate;
    forming a second solder mask over a second surface of the substrate;
    forming a first opening through the insulating material of the substrate outside a footprint of the conductive via;
    disposing a first semiconductor die over the substrate, wherein the first semiconductor die includes a microelectromechanical system (MEMS) microphone;
    forming a bond wire electrically coupled between the substrate and first semiconductor die;
    disposing a second semiconductor die over the substrate outside a footprint of the first semiconductor die including a conductive bump electrically coupled between the substrate and second semiconductor die; and
    disposing a lid over the first semiconductor die and second semiconductor die with a second opening formed through the lid.

16. The method of claim 15, further including forming the second opening aligned with the first semiconductor die.

17. The method of claim 15, wherein the lid extends over side surfaces of the first semiconductor die and second semiconductor die to physically contact the substrate.

18. The method of claim 17, further including attaching the lid to the substrate using an adhesive.

19. The method of claim 15, wherein the insulating material of the substrate includes a bismaleimide triazine (BT) resin.

20. A semiconductor device, comprising:
    a substrate including a first opening formed through the substrate;
    a conductive via formed through the substrate outside a footprint of the opening;
    a first semiconductor die disposed over the substrate;
    a thermally conductive paste disposed between the first semiconductor die and substrate;
    a bond wire coupled between the first semiconductor die and the substrate;
    a second semiconductor die disposed over the substrate outside a footprint of the first semiconductor die, wherein second semiconductor die is flip chip mounted onto the substrate with a plurality of conductive bumps; and
    a lid disposed over the first semiconductor die and second semiconductor die with a second opening formed through the lid, wherein a width of the lid is less than a width of the substrate.

21. The semiconductor device of claim 20, wherein the first semiconductor die includes a microelectromechanical system (MEMS).

22. The semiconductor device of claim 21, wherein the MEMS includes a microphone.

23. The semiconductor device of claim 20, wherein the first opening is aligned with the first semiconductor die.

24. The semiconductor device of claim 20, wherein the substrate includes a bismaleimide triazine (BT) resin.

25. The method of claim 24, further including:
    a first solder mask layer formed over the first surface of the substrate; and
    a second solder mask layer formed over the second surface of the substrate.

* * * * *